United States Patent
Kubo

(10) Patent No.: US 8,475,903 B2
(45) Date of Patent: Jul. 2, 2013

(54) INFORMATION RECORDING/REPRODUCING DEVICE

(75) Inventor: Kohichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 13/337,420

(22) Filed: Dec. 27, 2011

(65) Prior Publication Data

US 2012/0163090 A1  Jun. 28, 2012

(30) Foreign Application Priority Data

Dec. 27, 2010 (JP) ................................. 2010-290992

(51) Int. Cl.
*G11B 7/24* (2006.01)

(52) U.S. Cl.
USPC ..................... 428/64.1; 369/288; 365/163

(58) Field of Classification Search
USPC .......................... 428/64.1; 369/288
See application file for complete search history.

(56) References Cited

U.S. PATENT DOCUMENTS

| | | | |
|---|---|---|---|
| 7,733,684 B2 | 6/2010 | Kubo et al. | |
| 7,961,586 B2 * | 6/2011 | Kubo et al. | 369/126 |
| 8,014,189 B2 * | 9/2011 | Tsukamoto et al. | 365/148 |
| 8,089,796 B2 * | 1/2012 | Tsukamoto et al. | 365/63 |
| 8,188,455 B2 * | 5/2012 | Tsukamoto et al. | 257/5 |
| 8,269,205 B2 * | 9/2012 | Kubo et al. | 257/2 |
| 2007/0285967 A1 * | 12/2007 | Toda et al. | 365/148 |

* cited by examiner

*Primary Examiner* — Elizabeth Mulvaney
(74) *Attorney, Agent, or Firm* — Oblon, Spivak, McClelland, Maier & Neustadt, L.L.P.

(57) ABSTRACT

According to one embodiment, an information recording/reproducing device includes a recording layer, and a recording circuit configured to record information by generating a phase change in the recording layer while applying a voltage to the recording layer. The recording layer comprises a compound including at least one type of cationic element, and at least one type of anionic element, at least the one type of cationic element is a transition element including a d orbital incompletely filled with electrons, and the average shortest distance between adjacent cationic elements is 0.32 nm or less, and the recording layer is provided with a material selected from (i) $A_xM_yX_4$ ($0 \leq x \leq 2.2$, $1.8 \leq y \leq 3$), (ii) $A_xM_yX_3$ ($0 \leq x \leq 1.1$, $0.9 \leq y \leq 3$), and (iii) $A_xM_yX_4$ ($0 \leq x \leq 1.1$, $0.9 \leq y \leq 3$).

14 Claims, 19 Drawing Sheets

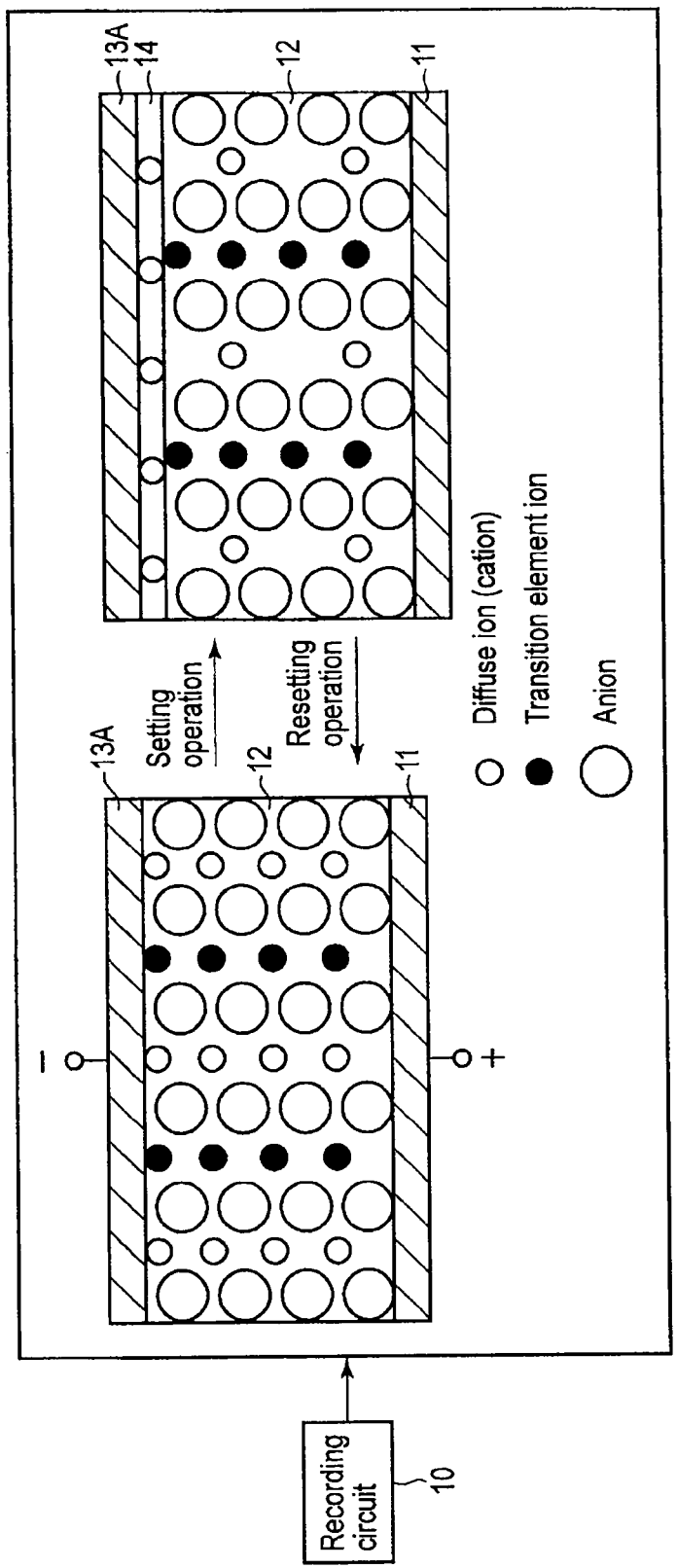
F I G. 1

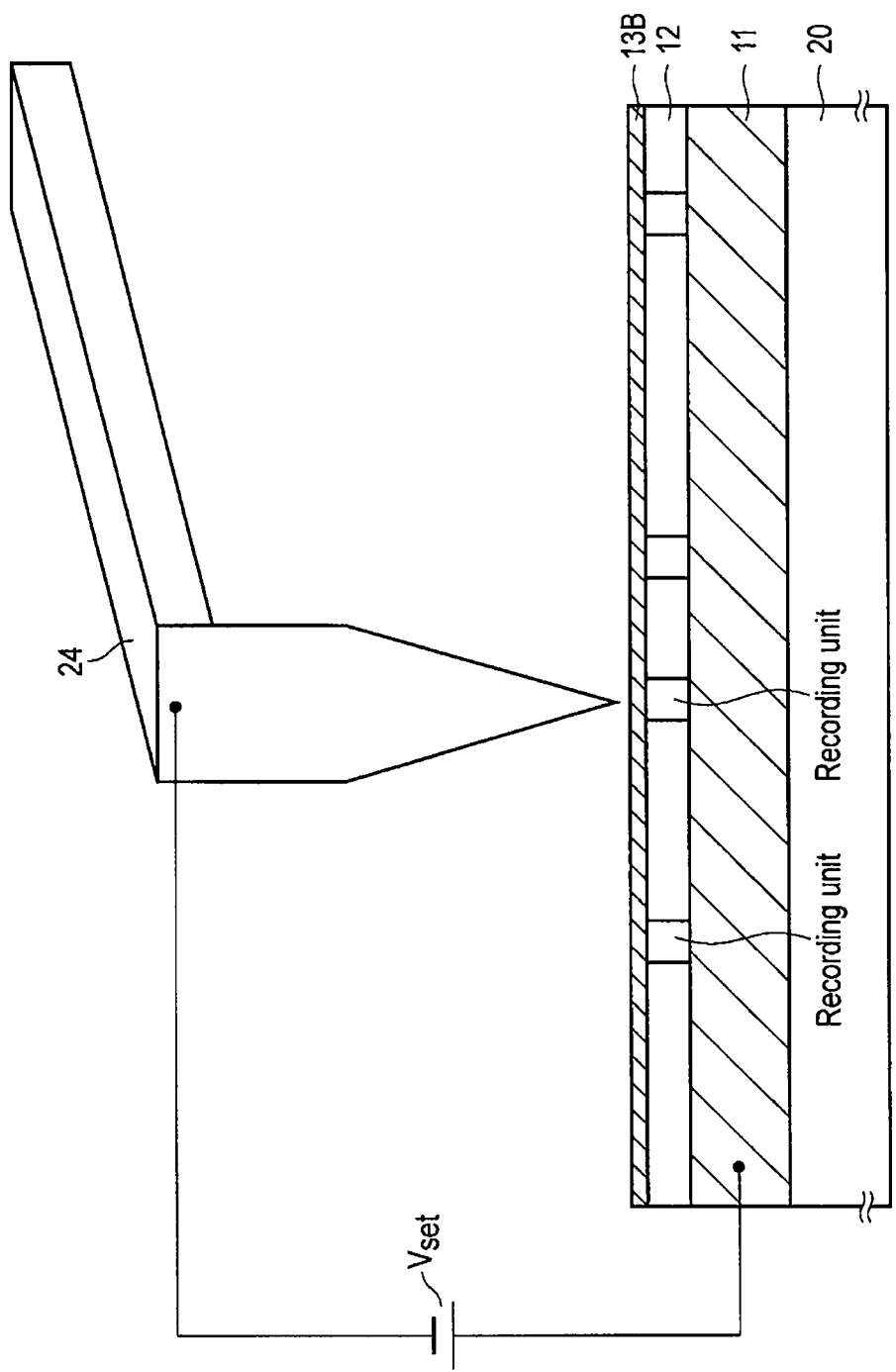
F I G. 4

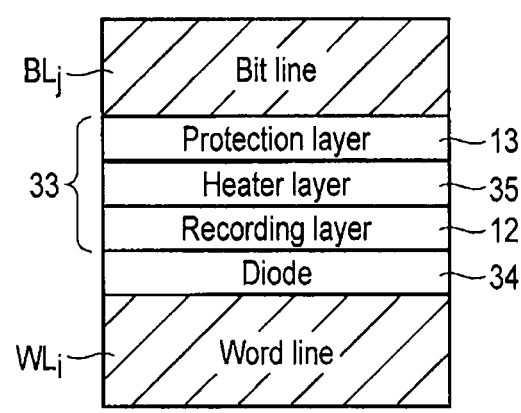
F I G. 10

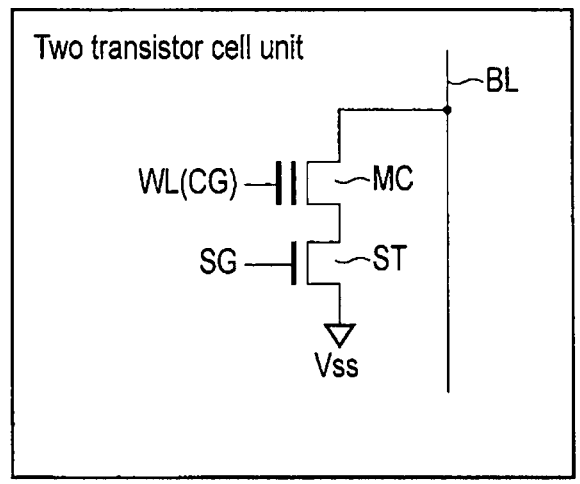
F I G. 20
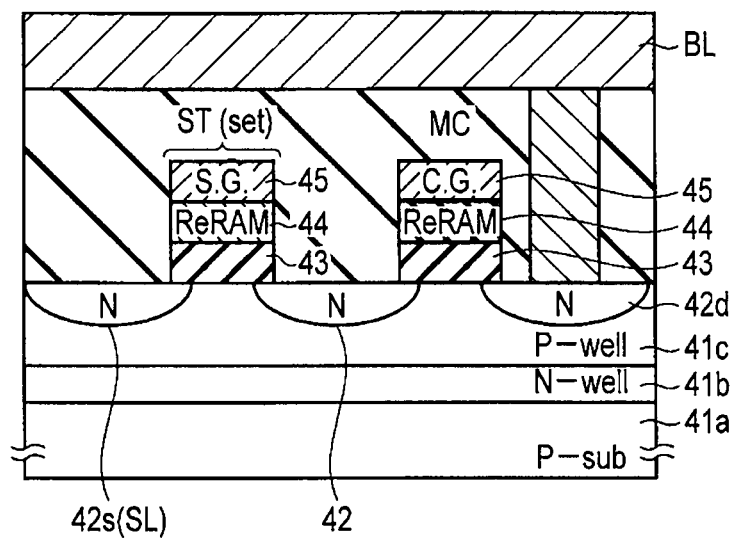
F I G. 21

INFORMATION RECORDING/REPRODUCING DEVICE

CROSS-REFERENCE TO RELATED APPLICATIONS

This application is based upon and claims the benefit of priority from prior Japanese Patent Application No. 2010-290992, filed Dec. 27, 2010, the entire contents of which are incorporated herein by reference.

FIELD

Embodiments described herein relate generally to an information recording/reproducing device with a high recording density.

BACKGROUND

In recent years, small-sized portable devices have become widespread and, at the same time, a demand for small-sized large-capacity nonvolatile memories has rapidly increased concomitantly with drastic progress of the high-speed information transmission network. Among the nonvolatile memories, a NAND flash memory and small-sized hard disk drive (HDD) have particularly achieved rapid evolution in recording density, and have constituted a large market.

However, it has been pointed out that both of them have reached the limit of recording density. That is, they confront a problem that with the NAND flash memory, an increase in processing cost concomitant with reduction in the minimum line width is remarkable, and with the small-sized HDD, tracking accuracy cannot be sufficiently secured.

Under these circumstances, several ideas for new memories aiming at largely exceeding the limit of recording density are proposed.

BRIEF DESCRIPTION OF THE DRAWINGS

FIG. 1 is a view showing a principle of information recording.

FIG. 4 is a view showing a state at the time of information recording of the probe memory.

FIG. 10 is a view showing an example of a memory cell structure.

FIG. 20 is a circuit diagram showing a two-transistor cell unit.

FIG. 21 and FIG. 22 are views each showing the structure of the two-transistor cell unit.

DETAILED DESCRIPTION

Figure 2:
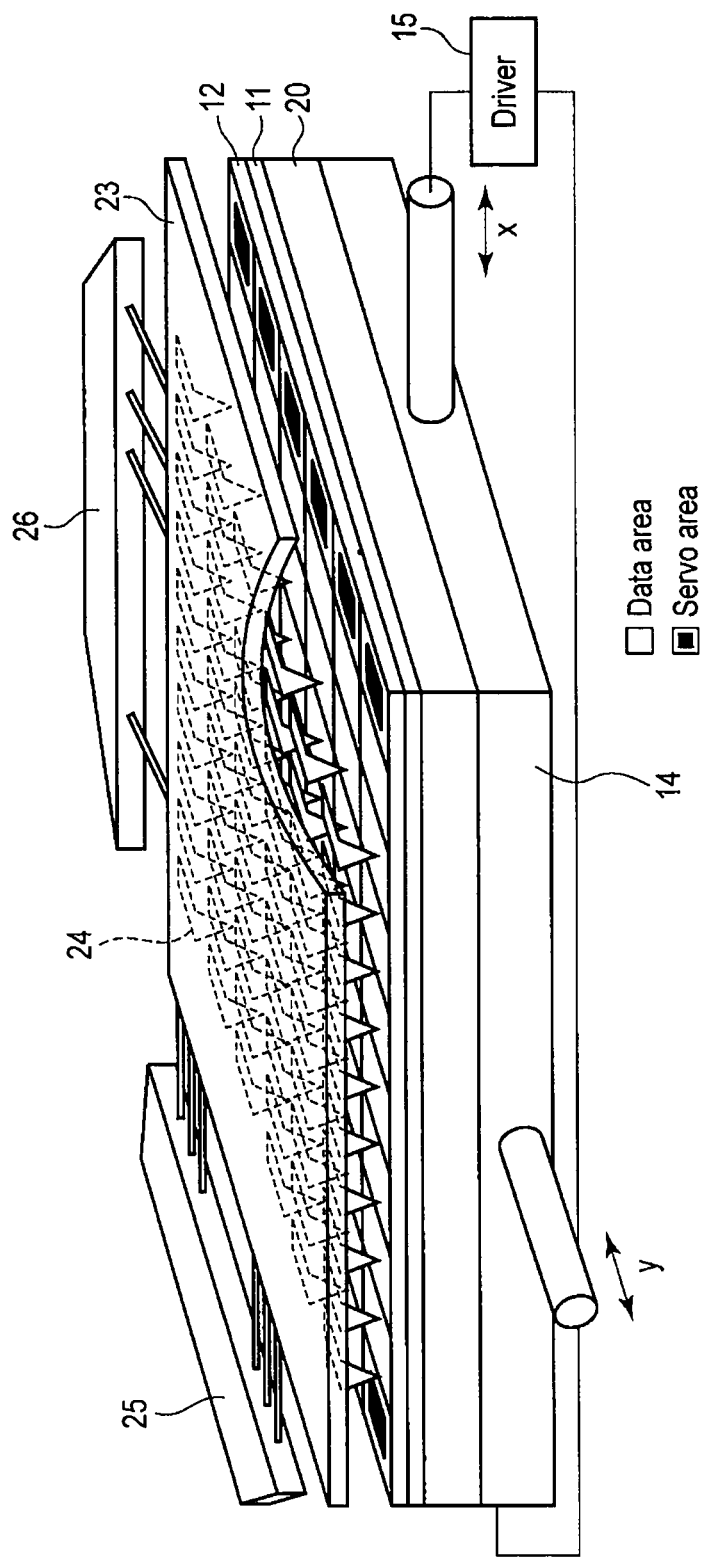
FIG. 2 is a view showing a probe memory.

In general, according to one embodiment, an information recording/reproducing device comprising: a recording layer; and a recording circuit configured to record information by generating a phase change in the recording layer while applying a voltage to the recording layer, wherein the recording layer comprises a compound including at least one type of cationic element, and at least one type of anionic element, at least the one type of cationic element is a transition element including a d orbital incompletely filled with electrons, and the average shortest distance between adjacent cationic elements is 0.32 nm or less, and the recording layer is provided with a material selected from (i) $A_xM_yX_4$ ($0 \leq x \leq 2.2$, $1.8 \leq y \leq 3$), (ii) $A_xM_yX_3$ ($0 \leq x \leq 1.1$, $0.9 \leq y \leq 3$), and (iii) $A_xM_yX_4$ ($0 \leq x \leq 1.1$, $0.9 \leq y \leq 3$), where, regarding (i) and (ii), A is at least one type of element selected from a group comprising Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb, and Bi; and M is at least one type of element selected from a group comprising Al, Ga, Ti, Ge, Sn, V, Cr, Mn, Fe, Co, Ni, Nb, Ta, Mo, W, Ru, and Rh, regarding (iii), A is at least one type of element selected from a group comprising Mg, Ca, Sr, Al, Ga, Sb, Ti, V, Cr, Mn, Fe, Co, Rh, In, Sb, Tl, Pb, and Bi; and M is at least one type of element selected from a group comprising Al, Ga, Ti, Ge, Sn, V, Nb, Ta, Cr, Mn, Mo, W, Ir, and Os, and regarding (i), (ii) and (iii), X contains O or N as a chief ingredient, and contains a halogen element of 1% or more and 30% or less.

Hereinafter, examples will be described with reference to the drawings.

1. Reference Technique

An example of an idea for a new memory aiming at high recording density will be described below.

For example, a phase-change memory (PRAM) uses a material which can take two states including an amorphous (on) state, and crystalline (off) state as a recording material, and employs a principle that data is recorded by causing the two states to correspond to binary data items "0", and "1", respectively.

Regarding write/erase, the amorphous state is formed by, for example, applying a high-power pulse to the recording material and, the crystalline state is formed by applying a low-power pulse to the recording material.

Regarding read, the operation is carried out by causing a small read current of such a degree that write/erase is not caused to flow through the recording material, and measuring the electrical resistance of the recording material. The electrical resistance value of the recording material in the amorphous state is greater than the resistance value of the recording material in the crystalline state, and the difference between them is of the order of $10^3$.

The greatest advantage of the PRAM is that the operation can be achieved even when the element size is reduced to about 10 nm and, in this case, a recording density of about 10 tera bit per square inch (Tbpsi) can be realized, and hence the PRAM is made a candidate for a memory realizing high recording density.

Further, although different from the PRAM, a new memory having a principle of operation quite similar to the PRAM is reported.

According to this report, the representative example of the recording material used to record data is nickel oxide and, a high-power pulse, and low-power pulse are used for write, and erase, respectively as in the case of the PRAM. In this case, an advantage that the electric power consumption at the time of write/erase is smaller than the PRAM is reported.

At present, although the operation mechanism of the new memory is not made clear yet, the reproducibility thereof is already confirmed, and the new memory is made another candidate for a memory realizing high recording density. Further, regarding the operation mechanism, some researcher groups are now trying to clarify the mechanism.

Besides these memories described above, a MEMS memory utilizing the micro electro mechanical systems (MEMS) technique is proposed.

Particularly, a MEMS memory called a Millipede has a structure in which array-shaped cantilevers and a recording medium coated with an organic substance are opposed to each other, and a probe provided at distal ends of the cantilevers is kept in contact with the recording medium by appropriate pressure.

Regarding write, the operation is carried out by controlling the temperature of a heater attached to the probe. That is, when the temperature of the heater is raised, the recording medium is softened, and the probe is sunk into the recording medium, thereby forming a depression on the recording medium.

Regarding read, the operation is carried out by causing the probe to scan the surface of the recording medium while causing a current of such a degree that the recording medium is not softened to flow through the probe. When the probe falls into the depression of the recording medium, the temperature of the probe is lowered, and the resistance value of the heater is increased, and hence it is possible to sense the data by reading a change in the resistance value.

The greatest advantage of the MEMS memory such as the millipede is that a wiring need not be provided to each recording section configured to record bit data, and hence the recording density can be tremendously improved. Under the existing circumstances, a recording density of the order of 1 Tbpsi has already been achieved.

Further, upon receipt of the announcement of the millipede, an attempt to achieve a remarkable improvement in the power consumption, recording density, operation speed, and the like by combining the MEMS technique and a new recording principle is recently made.

For example, a system in which a ferroelectric substance layer is provided in the recording medium, and data recording is carried out by applying a voltage to the recording medium to thereby cause dielectric polarization in the ferroelectric substance layer is proposed. According to this system, there is a theoretical prediction indicating that it is possible to make a space (recording minimum unit) between recording sections configured to record bit data small to the unit cell level.

If the recording minimum unit becomes one unit cell of the crystal of the ferroelectric substance layer, the recording density becomes a huge value of about 4 peta bit per square inch (Pbpsi).

However, although a MEMS memory of such ferroelectric substance recording is based on a previously known principle, the MEMS memory has not been realized even now.

The prime reason for the above is that an electric field coming out of the recording medium is shielded by ions in the air. That is, the electric field from the recording medium cannot be sensed, and hence read cannot be carried out.

Further, there is also a reason that if a lattice defect exists in the crystal, the charge resulting from the lattice defect moves to the recording section to shield the charge.

The former problem of electric field shielding carried out by the ions in the air has recently been solved by a proposal of a read system using a scanning nonlinear dielectric constant microscope (SNDM), and the new memory has considerably evolved toward practical application.

2. Outline

In an information recording/reproducing device of an example, a recording section includes a stacked structure comprising an electrode layer, recording layer, and protection layer.

A material used as the recording layer is to be a complex compound including at least two types of cationic elements. Further, at least one type of the cationic elements is to be a transition element including a d orbital incompletely filled with electrons, and the average shortest distance between adjacent cationic elements is to be 0.32 nm or less.

Here, it is specified that the average shortest distance between adjacent cationic elements is to be 0.32 nm or less for the purpose of improving the electron conductance, thereby consequently leading to extension of the cycle life.

More specifically, a recording layer satisfying the above conditions is constituted by using a material having the following chemical formula.

$$A_xM_yX_4$$

A is at least one type of element selected from a group comprising Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb, and Bi.

Further, it is more desirable that A be at least one type of element selected from a group comprising Mg, Al, Mn, Fe, Co, Ni, and zn. This is because when each of these elements is used, the ionic radius configured to maintain the crystalline structure is optimized, and the ionic mobility can also be sufficiently secured.

M is at least one type of element selected from a group comprising Al, Ga, Ti, Ge, Sn, V, Cr, Mn, Fe, Co, Ni, Nb, Ta, Mo, W, Ru, and Rh.

Further, it is more desirable that M be at least one type of element selected from a group comprising V, Cr, Mn, Fe, Co, and Ni. This is because when each of these elements is used, it becomes easier to control the electronic state in the crystal.

X is to include O or N as a chief ingredient, and include a halogen element of 1% or more and 30% or less, and the molar ratios x, and y are to satisfy the following conditions $0 \leq x \leq 2.2$, and $1.8 \leq y \leq 3$, respectively.

Here, regarding the content of the halogen element, 1%, i.e., the lower limit is a value set for the reason of necessity for improvement of the cycle life, and 30%, i.e., the upper limit is a value set to maintain the crystalline structure of $A_xM_yX_4$.

$$A_xM_yX_3$$

A is at least one type of element selected from a group comprising Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb, and Bi.

Further, it is more desirable that A be at least one type of element selected from a group comprising Mg, Al, Mn, Fe, Co, Ni, and zn. This is because when each of these elements is used, the ionic radius configured to maintain the crystalline structure is optimized, and the ionic mobility can also be sufficiently secured.

M is at least one type of element selected from a group comprising Al, Ga, Ti, Ge, Sn, V, Cr, Mn, Fe, Co, Ni, Nb, Ta, Mo, W, Ru, and Rh.

Further, it is more desirable that M be at least one type of element selected from a group comprising V, Cr, Mn, Fe, Co, and Ni. This is because when each of these elements is used, it becomes easier to control the electronic state in the crystal.

A and M are elements different from each other, and X includes at least one type of element selected from a group comprising O and N as a chief ingredient, and further includes a halogen element of 1% or more and 30% or less. The molar ratios x, and y are to satisfy the following conditions $0 \leq x \leq 1.1$, and $0.9 \leq y \leq 3$, respectively.

Here, regarding the content of the halogen element, 1%, i.e., the lower limit is a value set for the reason of necessity for improvement of the cycle life, and 30%, i.e., the upper limit is a value set to maintain the crystalline structure of $A_xM_yX_3$.

A is at least one type of element selected from a group comprising Mg, Ca, Sr, Al, Ga, Sb, Ti, V, Cr, Mn, Fe, Co, Rh, In, Tl, Pb, and Bi.

Further, it is more desirable that A be at least one type of element selected from a group comprising Mg, Al, Ga, Sb, Ti, Mn, Fe, and Co. This is because when each of these elements is used, the ionic radius configured to maintain the crystalline structure is optimized, and the ionic mobility can also be sufficiently secured.

M is at least one type of element selected from a group comprising Al, Ga, Ti, Ge, Sn, V, Nb, Ta, Cr, Mn, Mo, W, Ir, and Os.

Further, it is more desirable that M be at least one type of element selected from a group comprising Cr, Mn, Mo, and W. This is because when each of these elements is used, it becomes easier to control the electronic state in the crystal.

X is to contain O or N as a chief ingredient, and contain a halogen element of 1% or more and 30% or less, and the molar ratios x, and y are to satisfy the conditions $0 \leq x \leq 1.1$, and $0.9 \leq y \leq 3$, respectively.

Here, regarding the content of the halogen element, 1%, i.e., the lower limit is a value set for the reason of necessary for improvement of the cycle life, and 30%, i.e., the upper limit is a value set to maintain the crystalline structure of $A_xM_yX_4$.

It should be noted that regarding the molar ratios x, and y of each of the three materials ($A_xM_yX_4$, $A_xM_yX_3$, and $A_xM_yX_4$), the lower limit of the numerical value range is set to maintain the crystalline structure, and the upper limit thereof is set to control the electronic state in the crystal.

Further, the material used for the recording layer is to be a material of a crystal corresponding to one of the following crystalline structure group.

Spinel structure
Cryptomelane structure
Ilmenite structure
Wolframite structure
Hollandite structure
Hetaerolite structure
Ramsdellite structure
Delafossite structure
α-NaFeO$_2$ structure
LiMoN$_2$ structure By using a material described above for the recording layer, regarding the recording density, it is possible to theoretically realize the level of Pbpsi and, furthermore achieve lower power consumption.

3. Basic Principle of Recording/Reproduction

The basic principle of recording/reproduction of information in the information recording/reproducing device of the example will be described below.

FIG. 1 shows the structure of the recording section, and recording circuit.

Reference symbol 11 denotes an electrode layer, reference symbol 12 denotes a recording layer, and reference symbol 13A denotes an electrode layer (or a protection layer).

Recording circuit 10 is a circuit configured to record information by applying a voltage to recording layer 12 to cause recording layer 12 to generate a phase change.

Small white circles in recording layer 12 indicate diffuse ions, and small black circles indicate transition element ions. Further, large white circles indicate anions.

When a voltage is applied to recording layer 12, and a potential gradient is generated in the recording layer, part of the diffuse ions moves within the crystal. Thus, in the example, recording layer 12 in the initial state is made an insulator (high-resistance state) and, regarding information recording, recording is carried out by causing recording layer 12 to generate a phase change by the potential gradient, and imparting conductivity (low-resistance state) to recording layer 12.

First, a state where, for example, the potential of electrode layer 13A is relatively lower than that of electrode layer 11 is formed. Assuming that electrode layer 11 is kept at a fixed potential (for example, the ground potential), it is sufficient if a negative potential is given to electrode layer 13A.

At this time, part of the diffuse ions in recording layer 12 move to electrode layer (negative electrode) 13A side, and the number of the diffuse ions (cations) and transition element ions in recording layer (crystal) 12 becomes relatively smaller than that of the anions. The diffuse ions which have moved to electrode layer 13A side receive electrons from electrode layer 13A, and are deposited as metal, and hence metallic layer 14 is formed.

Inside recording layer 12, the number of anions becomes excessive and, consequently the valency of the transition element in recording layer 12 is increased. That is, although recording layer 12 is subjected to carrier injection, the carrier injection imparts electron conductivity to recording layer 12, thereby completing information recording (setting operation).

Regarding information reproduction, the reproducing operation can be easily carried out by injecting a current pulse into recording layer 12, and detecting the resistance value of recording layer 12. However, it is necessary that the current pulse should have such a small value that the material constituting recording layer 12 causes no phase change.

The process described above is a kind of electrolysis and, it is possible to consider that on electrode layer (positive electrode) 11 side, an oxidizing agent has been produced by electrochemical oxidization and, on electrode layer (negative electrode) 13A side, a reducing agent has been produced by electrochemical reduction.

Accordingly, in order to return the state (low-resistance state) of information recording to the initial state (high-resistance state), it is sufficient if, for example, recording layer 12 is subjected to Joule heating by applying a high-current pulse thereto to thereby promote the oxidization/reduction reaction of recording layer 12. That is, by the residual heat after shutting off the high-current pulse, recording layer 12 is returned to the insulator (resetting operation).

However, in order to put the principle of operation to practical use, it must be confirmed that a resetting operation is not caused (a sufficiently long retention time is secured) at room temperature, and that the power consumption of the resetting operation is sufficiently small.

Regarding the former, it is possible to cope with the matter by making the valency of the diffuse ions greater than or equal to bivalence.

Further, regarding the latter, it is possible to cope with the matter by finding a material having a crystalline structure including an ion radius and moving path of diffuse ions moving inside recording layer (crystal) 12 without causing crystal destruction. Regarding such recording layer 12, it is sufficient if an element and crystalline structure which have already been described are employed.

Incidentally, an oxidizing agent is produced on electrode layer (positive electrode) 11 side after the setting operation, and hence it is desirable that electrode layer 11 comprises a material hard to oxidize (for example, electro-conductive nitride, electro-conductive oxide, and the like).

Further, it is recommendable to employ a material having no ionic conductivity as such a material.

As such materials, there are materials shown below and, among these materials, $LaNiO_3$ can be regarded as the most desirable material from the viewpoint of the overall performance determined by taking excellence in electric conductivity into account.

MN

M is at least one type of element selected from a group comprising Ti, Zr, Hf, V, Nb, and Ta. N is nitrogen.

$MO_x$

M is at least one type of element selected from a group comprising Ti, V, Cr, Mn, Fe, Co, Ni, Cu, Zr, Nb, Mo, Ru, Rh, Pd, Ag, Hf, Ta, W, Re, Ir, Os, and Pt. The molar ratio x is to satisfy the condition $1 \leq x \leq 4$.

$AMO_3$

A is at least one type of element selected from a group comprising La, K, Ca, Sr, Ba, and Ln (Lanthanide).

M is at least one type of element selected from a group comprising Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one type of element selected from a group comprising K, Ca, Sr, Ba, and Ln (Lanthanide).

M is at least one type of element selected from a group comprising Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Further, a reducing agent is produced on protection layer (negative electrode) 13 side after the setting operation, and hence it is desirable that protection layer 13 should have a function of preventing recording layer 12 from reacting with the air. Examples of such a material are semiconductors such as amorphous carbon, diamond-like carbon, and $SnO_2$.

Electrode layer 13A may be caused to function as a protection layer configured to protect recording layer 12, and a protection layer may be provided in place of electrode layer 13A. In this case, the protection layer may be an insulator or may be an electric conductor.

Further, in order to efficiently carry out heating of recording layer 12 in the resetting operation, it is desirable that a heater layer (a material having resistivity of about $10^{-5}$ Ωcm or more) be provided on the negative electrode side, i.e., on electrode layer 13A side in this case.

As a method of simultaneously achieving the advantage of effectively heating only the recording layer while protecting the electrode described above, it is better to use a method in which a Peltier element film is inserted between both of them.

By inserting a P-type Peltier element film between, for example, the positive electrode and a ReRAM film, an effect of transporting heat in the direction from the positive electrode toward the ReRAM film is brought about.

As a result, it is possible to efficiently heat the ReRAM while preventing the electrode from being deteriorated by cooling the electrode while the operation is carried out, and thus each of the cycle life, resetting probability, and power consumption at the time of resetting advances toward characteristic improvement.

As a P-type Peltier element film material, although a material having a large Peltier coefficient Π is desirable, the Peltier coefficient Π is expressed by a relationship $Π=αT$, in which the Peltier coefficient Π is a product of the Seebeck coefficient α and temperature T, whereby it can be said that a material having a large Seebeck coefficient is desirable.

Furthermore, it is known that the Seebeck coefficient is large in a material in which the state density is steep on the Fermi surface, and hence a material having a crystalline structure of the strongly-correlated system, and low-dimensional structure is desirable as a material satisfying the above condition.

Examples of such a material are $Ca_3Co_4O_9$, $LaCaCoO_4$, $La_2CuO_4$, $CuAlO_2$, and the like.

Further, these materials require lower resistance than the ReRAM material, and hence it is desirable that materials obtained by positively injecting a certain amount of P-type carriers into these materials to make their resistance lower be used, and it is further known that each of these obtained materials actually has a Seebeck coefficient of 100 μV/K or more. Accordingly, when these films are used, in terms of calculation, an electrode cooling effect of 30% or more and 100% or less can be expected for the total calorific value of the ReRAM at the time of resetting.

4. Application Examples

Next, application examples will be described below.

Hereinafter, examples will be described about two cases where the embodiment is applied to a probe memory, and where the embodiment is applied to a semiconductor memory.

(1) Probe Memory

A. Structure

Figure 3:
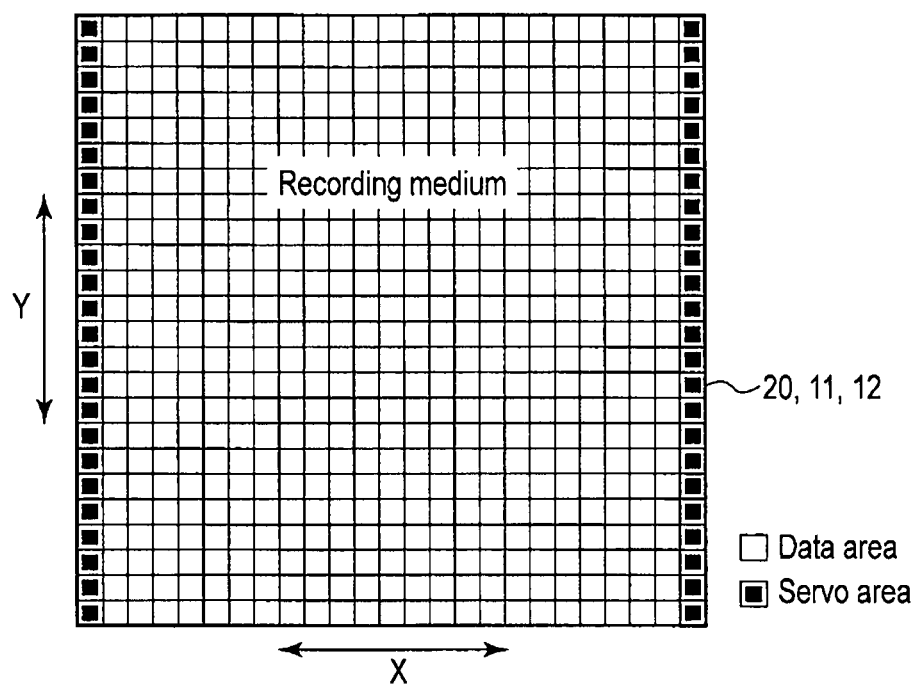
FIG. 3 is a view showing a data area divided into blocks.

FIG. 2 and FIG. 3 each show a probe memory.

A recording medium is arranged on XY scanner 14. A probe array is arranged in opposition to the recording medium.

The probe array includes substrate 23, and probes (heads) 24 arranged on one side of substrate 23 in an array form. Each of probes 24 comprises, for example, a cantilever, and is driven by multiplex drivers 25 and 26.

Although each of probes 24 can be separately operated by using a micro-actuator in substrate 23, here an example in which access to the data area of the recording medium is obtained by collectively causing all probes 24 to carry out the same operation will be described below.

First, all probes 24 are reciprocally operated in the X direction at a fixed frequency by using multiplex drivers 25 and 26, and position information of the Y direction is read from a servo area of the recording medium. The position information of the Y direction is transferred to driver 15.

Driver 15 drives XY scanner 14 on the basis of the position information to move the recording medium in the Y direction, thereby carrying out positioning of the recording medium and probes.

When the positioning of both the recording medium and probes is completed, read or write of data is carried out simultaneously and continuously for all probes 24 on the data area.

Probes 24 are reciprocally operated in the X direction, and hence read or write of data is continuously carried out. Further, read or write of data is carried out line by line for the data area by changing the position of the recording medium in the Y direction in sequence.

It should be noted that the recording medium may be reciprocally operated in the X direction at a fixed frequency to read position information from the recording medium, and probes 24 may be moved in the Y direction.

The recording medium comprises, for example, substrate 20, electrode layer 11 on substrate 20, and recording layer 12 on electrode layer 11.

Recording layer 12 includes data areas, and servo areas arranged at both ends of data areas in the X direction. The data areas occupy a main part of recording layer 12.

In the servo area, a servo burst signal is recorded. The servo burst signal indicates position information of the Y direction in the data area.

In recording layer 12, besides the above information, an address area in which address data is recorded, and preamble area for synchronization are arranged.

Data and the servo burst signal are recorded on recording layer 12 as recording bits (electric resistance variation). The "1", and "0" information of the recording bits is read by detecting the electric resistance of recording layer 12.

In this example, one probe (head) is provided for one data area, and one probe is provided for one servo area in a one-to-one correspondence with each other.

The data area comprises tracks. A track in the data area is specified by an address signal read from the address area. Further, a servo burst signal read from the servo area is configured to move the probes to the center of the track to thereby eliminate a read error.

Here, by making the X direction correspond to the down-track direction, and making the Y direction correspond to the track direction, it becomes possible to utilize the head position control technique of the HDD.

B. Recording/Reproducing Operation

The recording/reproducing operation of the probe memory of FIG. 2 and FIG. 3 will be described below.

FIG. 4 shows information recording (setting operation).

It is assumed that the recording medium comprises electrode layer 11 on semiconductor chip 20/recording layer 12/protection layer 13B.

Information recording is carried out by applying a voltage to a recording unit of the recording layer (recording medium), and generating a potential gradient in the recording unit of recording layer 12 to thereby cause a current pulse to flow. In this example, a state where the potential of probe 24 is relatively lower than that of electrode layer 11 is formed. Assuming that electrode layer 11 is kept at a fixed potential (for example, the ground potential), it is sufficient if a negative potential is given to probe 24.

A current pulse is generated by using, for example, an electron generation source or a hot electron source, and emitting electrons from Probe 24 toward electrode layer 11.

Figure 5:
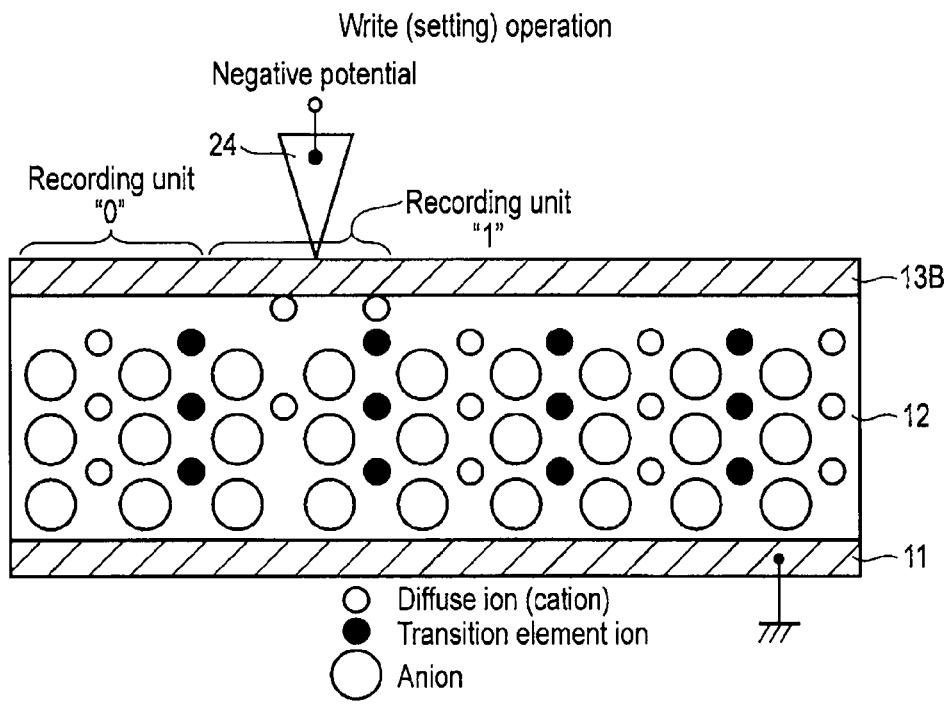
FIG. 5 is a view showing a write operation.

At this time, as shown in, for example, FIG. 5, in a recording unit of recording layer 12, part of diffuse ions move to probe (negative electrode) 24 side, and the number of diffuse ions (cations) in the crystal becomes relatively smaller than that of anions. Further, the diffuse ions which have moved to probe 24 side receive electrons from probe 24, and are deposited as metal.

Inside the recording unit of recording layer 12, the number of anions becomes excessive, and consequently the valency of the transition element in the recording unit of recording layer 12 is increased. That is, electron conductivity is imparted to the recording unit of recording layer 12 by carrier injection resulting from a phase change, and hence information recording (setting operation) is completed.

It should be noted that the current pulse for information recording can also be generated by creating a state where the potential of probe 24 is relatively higher than that of electrode layer 11.

Figure 6:
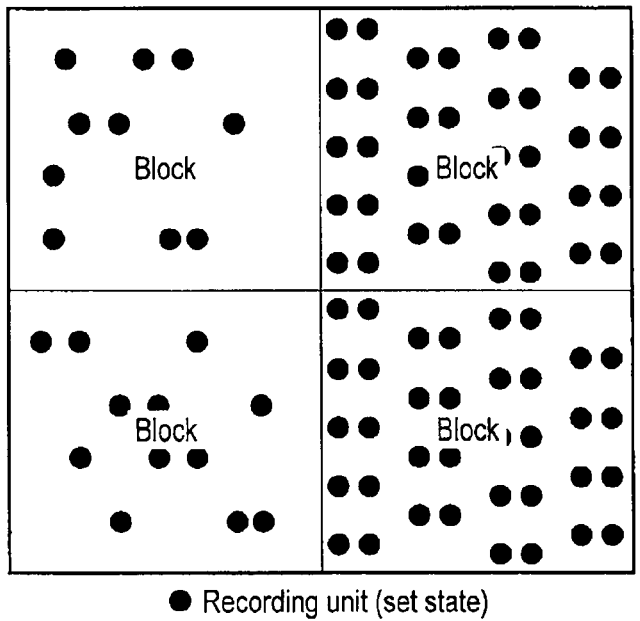
FIG. 6 is a view showing recording units in each block.

FIG. 6 shows blocks in the data area after completion of information recording.

Black circles indicate recording units in which information recording has already been carried out. According to the probe memory of this example, as in the case of the hard disk, it is possible to carry out information recording in the recording units of the recording medium and, further it is possible, by employing a new recording material, to realize higher recording density than the conventional hard disk and semiconductor memory.

Figure 7:
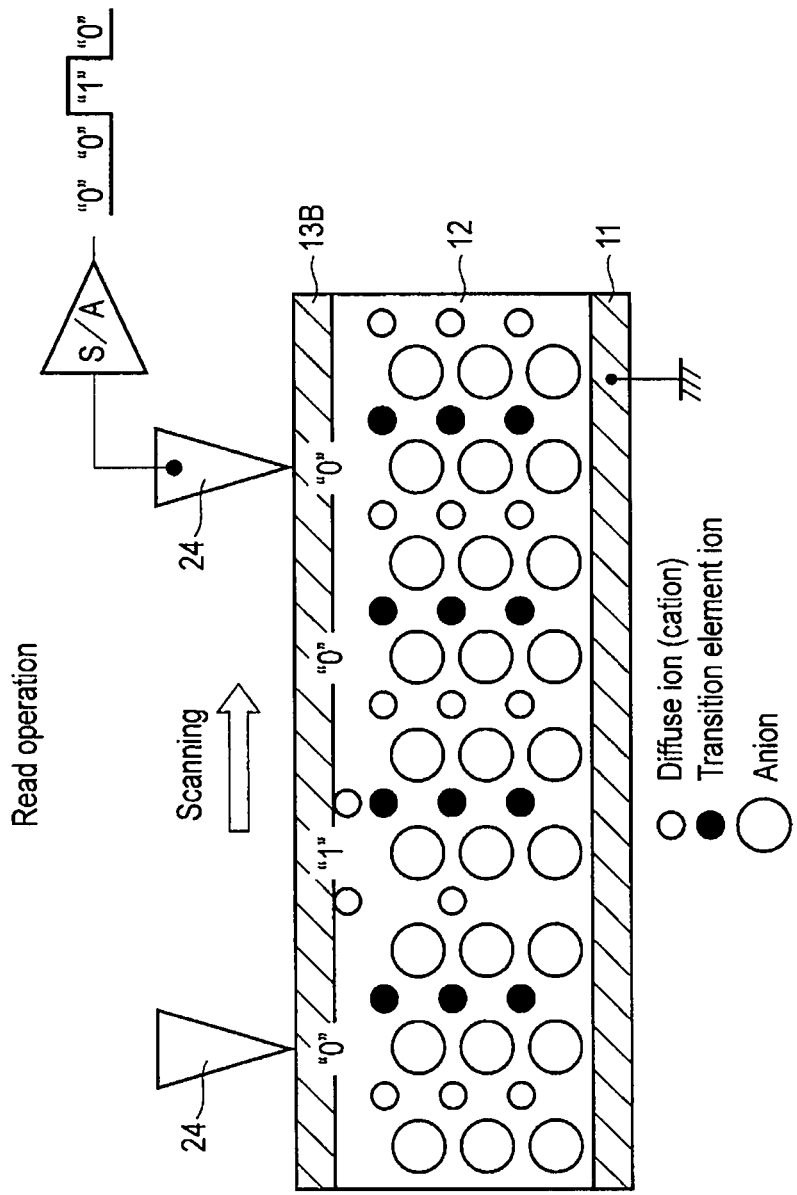
FIG. 7 is a view showing a read operation.

FIG. 7 shows information reproduction.

Regarding information reproduction, the reproducing operation is carried out by injecting a current pulse into the recording unit of recording layer 12, and detecting the resistance value of the recording unit of recording layer 12. However, the current pulse should have such a small value that the material constituting the recording unit of recording layer 12 causes no phase change.

For example, a read current (current pulse) generated by sense amplifier S/A is made to flow from probe 24 into the recording unit of recording layer (recording medium) 12, and the resistance value of the recording unit is measured by sense amplifier S/A. When the new material already described previously is employed, it is possible to secure a difference in resistance value of $10^3$ or more between the set state and reset state.

It should be noted that in the information reproduction, it becomes possible to carry out continuous reproduction by scanning the surface of the recording medium with probes 24.

Regarding the resetting (erase) operation, the operation is carried out by subjecting the recording unit of recording layer 12 to Joule heating by means of a high-current pulse to thereby promote the oxidization/reduction reaction in the recording unit of recording layer 12.

The resetting operation can be carried out for each recording unit, and can also be carried out for recording units or in units of blocks.

C. Summary

According to the probe memory described above, it is possible to realize higher recording density, and lower power consumption than the current hard disk and flash memory.

(2) Semiconductor memory

A. Structure

Figure 8:
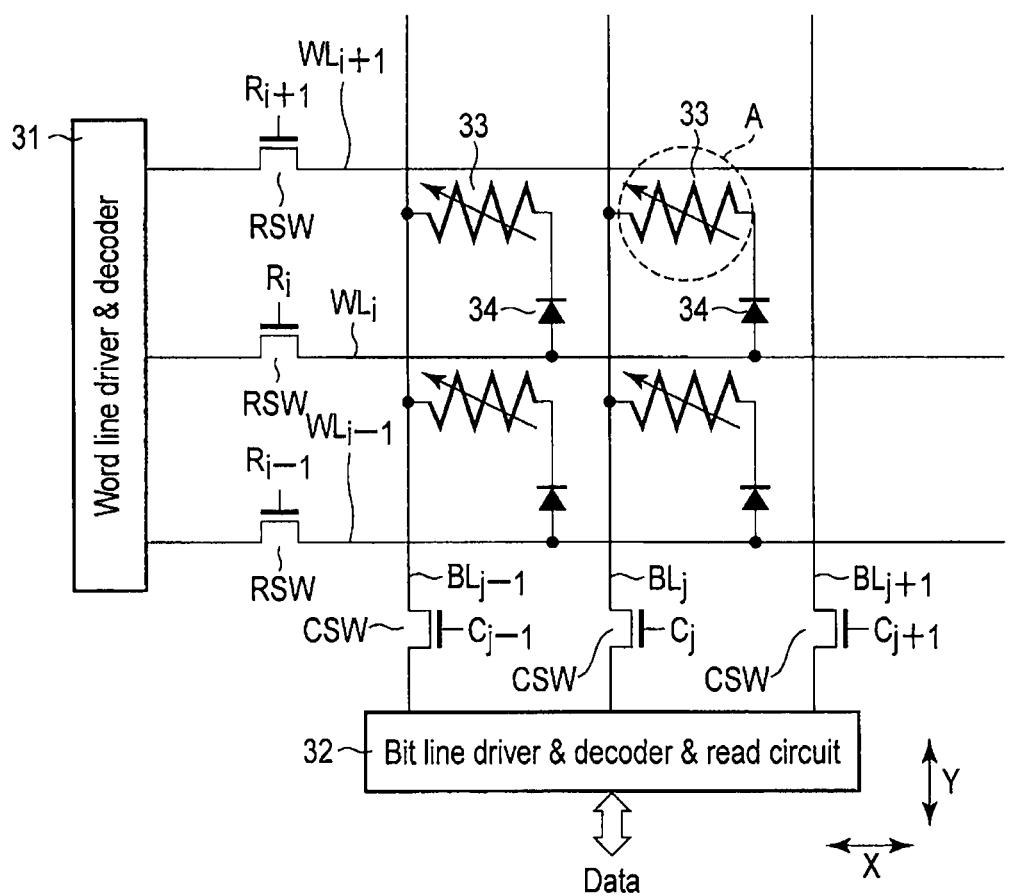
FIG. 8 is a view showing a semiconductor memory.

FIG. 8 shows a cross-point type semiconductor memory.

Word lines $WL_{i-1}$, $WL_i$, and $WL_{i+1}$ extend in the X direction, and bit lines $BL_{j-1}$, $BL_j$, and $BL_{j+1}$ extend in the Y direction.

One end of each of word lines $WL_{i-1}$, $WL_i$, and $WL_{i+1}$ is connected to word line driver & decoder 31 through MOS transistor RSW serving as a selection switch, and one end of each of bit lines $BL_{j-1}$, $BL_j$, and $BL_{j+1}$ is connected to bit line driver & decoder & read circuit 32 through MOS transistor CSW serving as a selection switch.

Selection signal $R_{i-1}$, $R_i$ or $R_{i+1}$ configured to select one word line (row) is input to a gate of MOS transistor RSW, and selection signal $C_{j-1}$, $C_j$ or $C_{j+1}$ configured to select one bit line (column) is input to a gate of MOS transistor CSW.

Memory cell 33 is arranged at each of intersections of word lines $WL_{i-1}$, $WL_i$, and $WL_{i+1}$, and bit lines $BL_{j-1}$, $BL_j$, and $BL_{j+1}$. The structure of the memory is a so-called cross-point type cell array structure.

Diode 34 configured to prevent a sneak current from being caused at the time of recording/reproduction is added to each memory cell 33.

Figure 9:
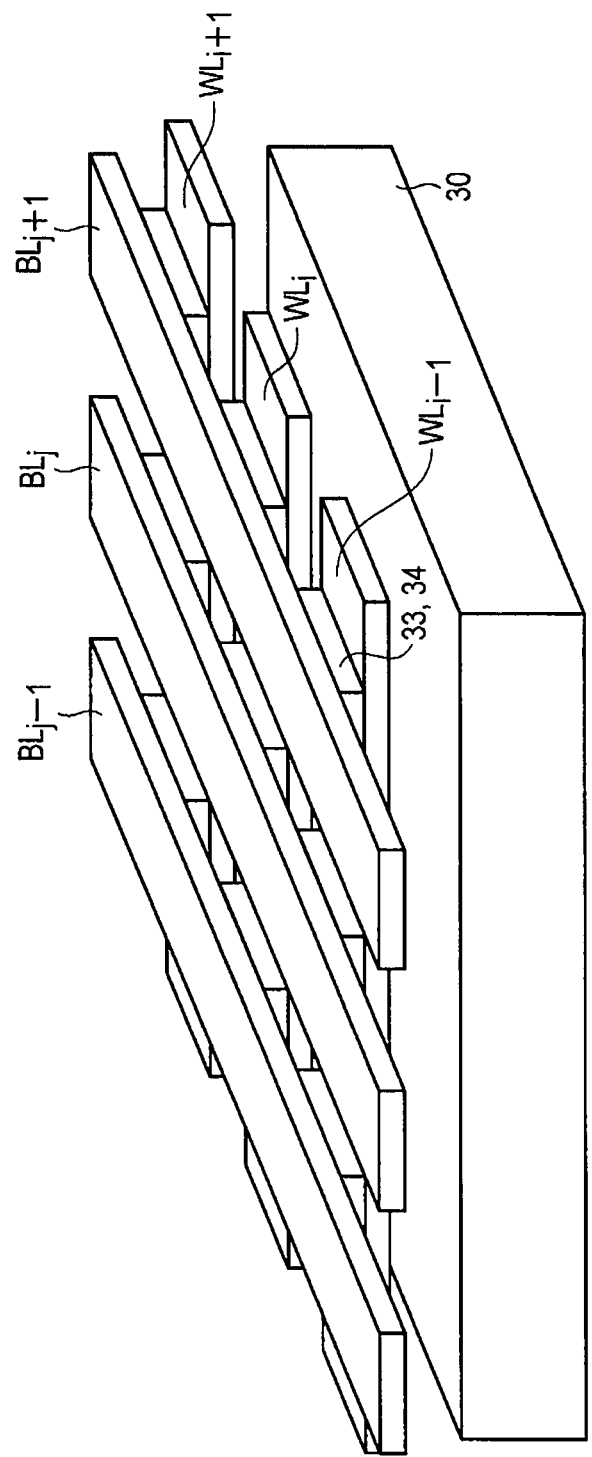
FIG. 9 is a view showing an example of a memory cell array structure.

FIG. 9 shows the structure of the memory cell array section of the semiconductor memory of FIG. 8.

Word lines $WL_{i-1}$, $WL_i$, and $WL_{i+1}$, and bit lines $BL_{j-1}$, $BL_j$, and $BL_{j+1}$ are arranged on semiconductor chip 30, and memory cells 33 and diodes 34 are arranged at intersections of these wirings.

Figure 11:
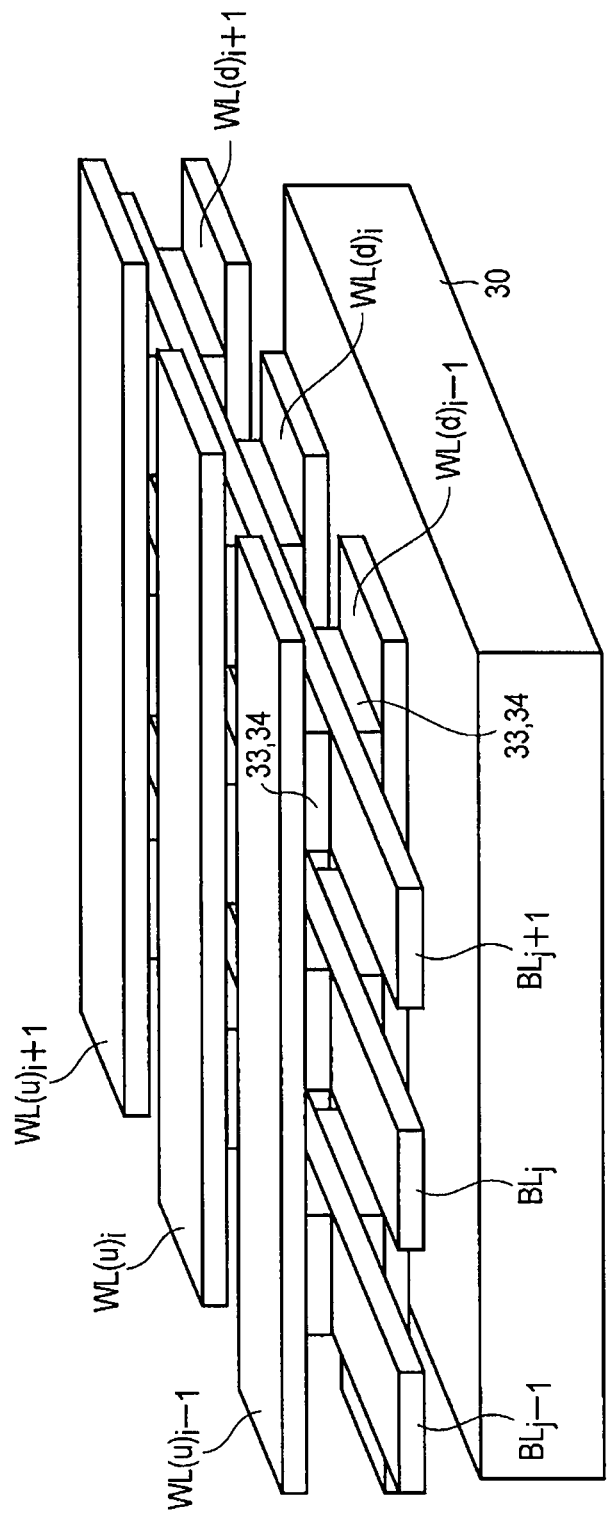
FIG. 11 and FIG. 12 are views showing examples of the memory cell array structure.
Figure 12:
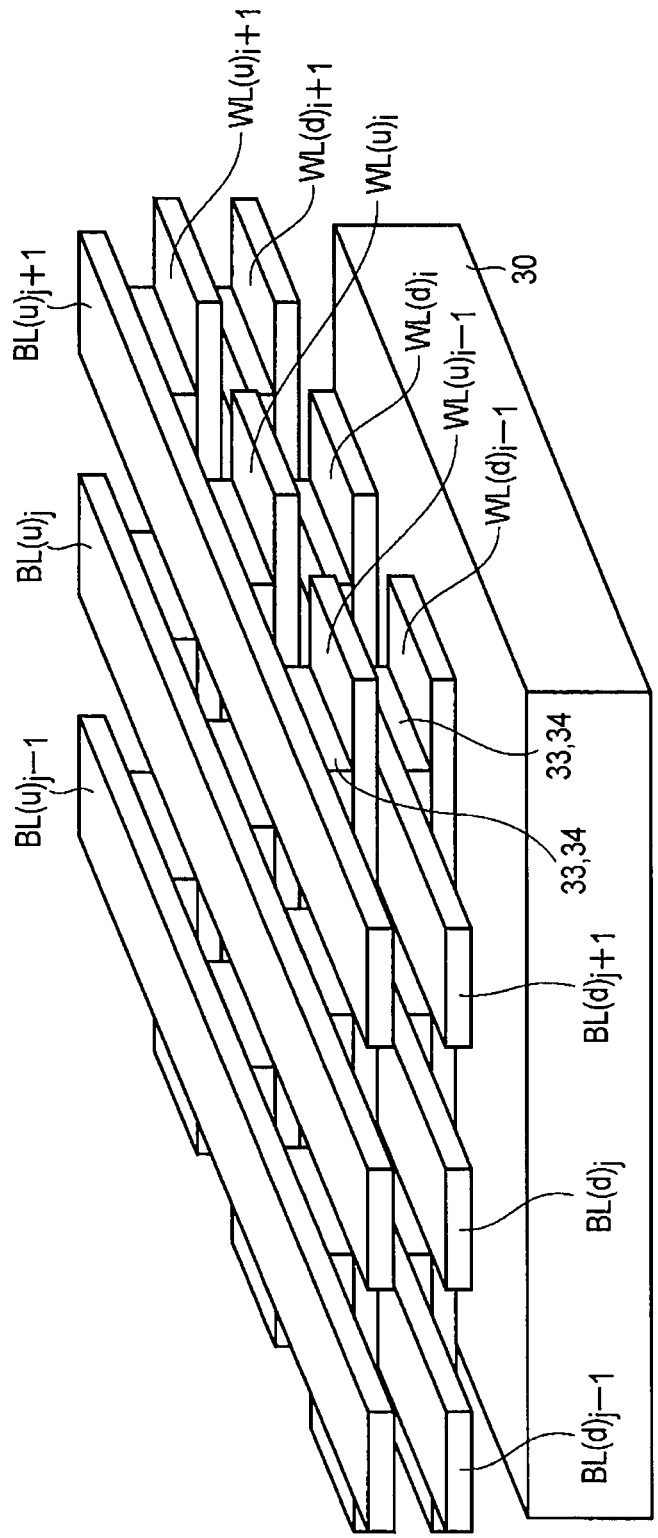

Requiring no individual connection of MOS transistors to the memory cells, the merit of such a cross-point type cell array structure consists in the advantage in high integration. For example, as shown in FIG. 11 and FIG. 12, it is also possible to impart a three-dimensional structure to the memory cell array by stacking memory cells 33.

As shown in, for example, FIG. 10, memory cell 33 comprises a stacked structure including recording layer 12, protection layer 13, and heater layer 35. One memory cell 33 stores therein 1-bit data. Further, diode 34 is arranged between word line $WL_i$ and memory cell 33.

B. Recording/Reproducing Operation

The recording/reproducing operation will be described below by using FIGS. 8 to 10.

Here, it is assumed that memory cell 33 encircled by dotted line A is selected, and the recording/reproducing operation is carried out for this selected memory cell 33.

Information recording (setting operation) is carried out by only applying a voltage to selected memory cell 33 to generate a potential gradient in memory cell 33, and to inject a current pulse thereinto, and hence a state where the potential of, for example, word line $WL_i$ is relatively lower than the potential of bit line $BL_j$ is formed. When bit line $BL_j$ is kept at a fixed potential (for example, ground potential), it is sufficient if a negative potential is given to the word line $WL_i$.

At this time, in memory cell 33 encircled by dotted line A, part of cations move to word line (negative electrode) $WL_i$ side, and the number of cations inside the crystal becomes relatively smaller than that of anions. Further, the cations which have moved to word line $WL_i$ side receive electrons from word line $WL_i$, and are deposited as metal.

Inside selected memory cell 33 encircled by dotted line A, the number of anions becomes excessive and, consequently the valency of the transition element in the crystal is increased. That is, electron conductivity is imparted to selected memory cell 33 encircled by dotted line A by carrier injection resulting from the phase change, whereby information recording (setting operation) is completed.

It should be noted that it is desirable that at the time of information recording, all unselected word lines $WL_{i-1}$ and $WL_{i+1}$, and unselected bit lines $BL_{j-1}$ and $BL_{j+1}$ be biased by the same potential.

Further, it is desirable that at the time of standby before the information recording, all word lines $WL_{i-1}$, and $WL_i$, and $WL_{i+1}$, and all bit lines $BL_{j-1}$, $BL_j$, and $BL_{j+1}$ be precharged.

Further, the current pulse for information recording may also be generated by forming a state where the potential of word line $WL_i$ is relatively higher than the potential of bit line $BL_j$.

Regarding information reproduction, the reproducing operation is carried out by injecting a current pulse into selected memory cell 33 encircled by dotted line A, and detecting the resistance value of memory cell 33. However, it is necessary that the current pulse should have such a small value that the material constituting memory cell 33 causes no phase change.

For example, a read current (current pulse) generated by the read circuit is made to flow from bit line $BL_j$ to memory cell 33 encircled by dotted line A, and the resistance value of memory cell 33 is measured by the read circuit. When the new material already described previously is employed, it is possible to secure a difference in resistance value of $10^3$ or more between the set state and reset state.

Regarding the resetting operation, the operation is carried out by subjecting memory cell 33 encircled by dotted line A to Joule heating by means of a high-current pulse to thereby promote the oxidization/reduction reaction in memory cell 33.

C. Summary

According to the semiconductor memory described above, it is possible to realize higher recording density, and lower power consumption than the current hard disk and flash memory.

(3) Others

In the embodiment, although the two items of the probe memory and semiconductor memory have been described, it is also possible to apply the material and principle proposed herein to the recording media such as the existing hard disk and DVD.

5. Application to Flash Memory (1) Structure

It is also possible to apply the example of the embodiment to a flash memory.

Figure 13:
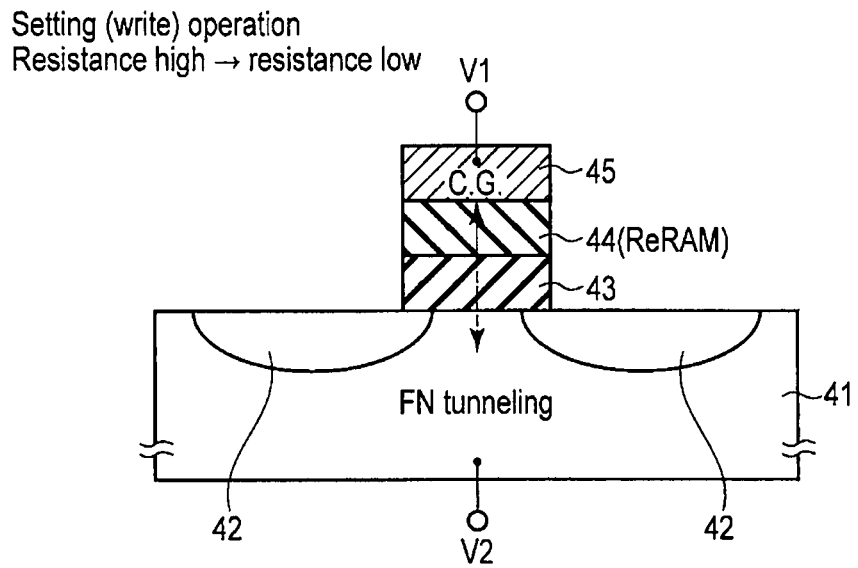
FIG. 13 is a view showing an example of application of the principle to a flash memory.
Figure 13:
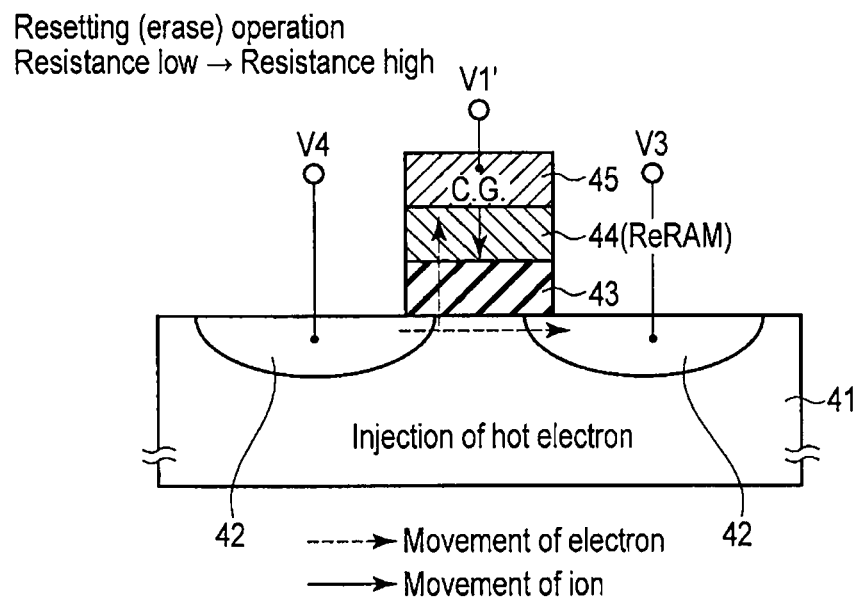

FIG. 13 shows a memory cell of a flash memory.

The memory cell of the flash memory comprises a metal-insulator-semiconductor (MIS) transistor.

Diffusion layer 42 is formed in each of surface regions of semiconductor substrate 41. On a channel region between diffusion layers 42, gate insulating layer 43 is formed. On gate insulating layer 43, recording layer (ReRAM: Resistive RAM) 44 according to an example of the embodiment is formed. On recording layer 44, control gate electrode 45 is formed.

Semiconductor substrate 41 may comprise a well region, and semiconductor substrate 41 and diffusion layer 42 have conductivity types opposite to each other. Control gate electrode 45 becomes a word line, and comprises, for example, conductive polysilicon.

Recording layer 44 comprises one of materials shown in Table. 1.

(2) Basic Operation

The basic operation will be described below by using FIG. 13.

A setting (write) operation is executed by applying potential V1 to control gate electrode 45, and applying potential V2 to semiconductor substrate 41.

Although it is necessary that a difference between potentials V1 and V2 has a value sufficient for recording layer 44 to cause a phase change or a resistance change, a direction thereof is not particularly limited. That is, either one of V1>V2 and V1<V2 may be selected.

For example, when it is assumed that recording layer 44 is an insulator (resistance is high) in the initial state (reset state), gate insulating layer 43 is substantially increased in thickness, and hence the threshold of the memory cell (MIS transistor) becomes higher.

In this state, when recording layer 44 is changed into a conductor (resistance is small) by application of potentials V1 and V2, gate insulating layer 43 is substantially decreased in thickness, and hence the threshold of the memory cell (MIS transistor) becomes lower.

It should be noted that although potential V2 has been applied to semiconductor substrate 41, instead, potential V2 may be transferred from diffusion layer 42 to the channel region of the memory cell.

The resetting (erase) operation is executed by applying a potential V1' to control gate electrode 45, applying potential V3 to one of diffusion layers 42, and applying potential V4 (<V3) to the other of diffusion layers 42.

Potential V1' is made a value exceeding the threshold of the memory cell in the set state.

At this time, the memory cell is turned on, electrons flow from the other one of diffusion layers 42 toward the one of diffusion layers 42, and hot electrons are generated. The hot electrons are injected into recording layer 44 through gate insulating layer 43, and hence the temperature of recording layer 44 is raised.

Thereby, recording layer 44 changes from the conductor (resistance is low) into the insulator (resistance is high), and hence gate insulating layer 43 becomes substantially thicker, and the threshold of the memory cell (MIS transistor) becomes higher.

As described above, the threshold of the memory cell can be changed by the principle similar to the flash memory, and hence it is possible to put the information recording/reproducing device according to the example of the embodiment into practical use by utilizing the technique of the flash memory.

(3) NAND flash Memory

Figure 14:
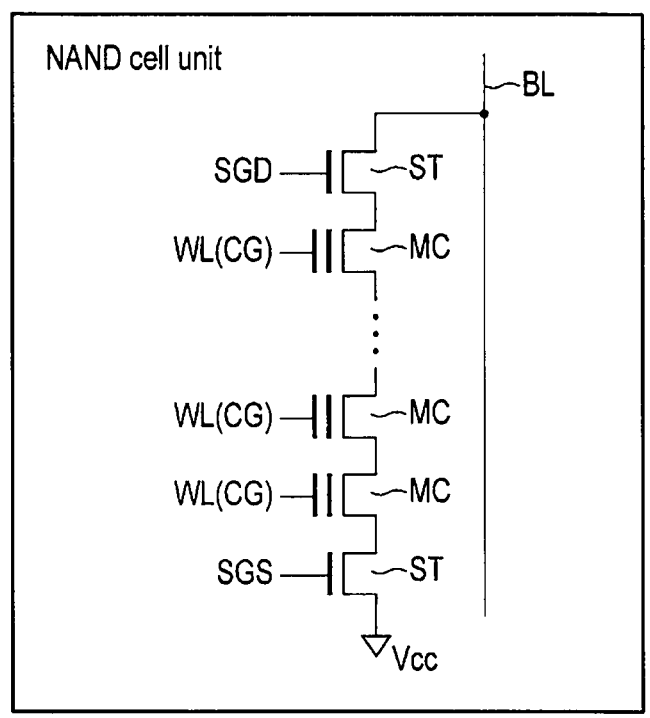
FIG. 14 is a circuit diagram showing a NAND cell unit.
Figure 15:
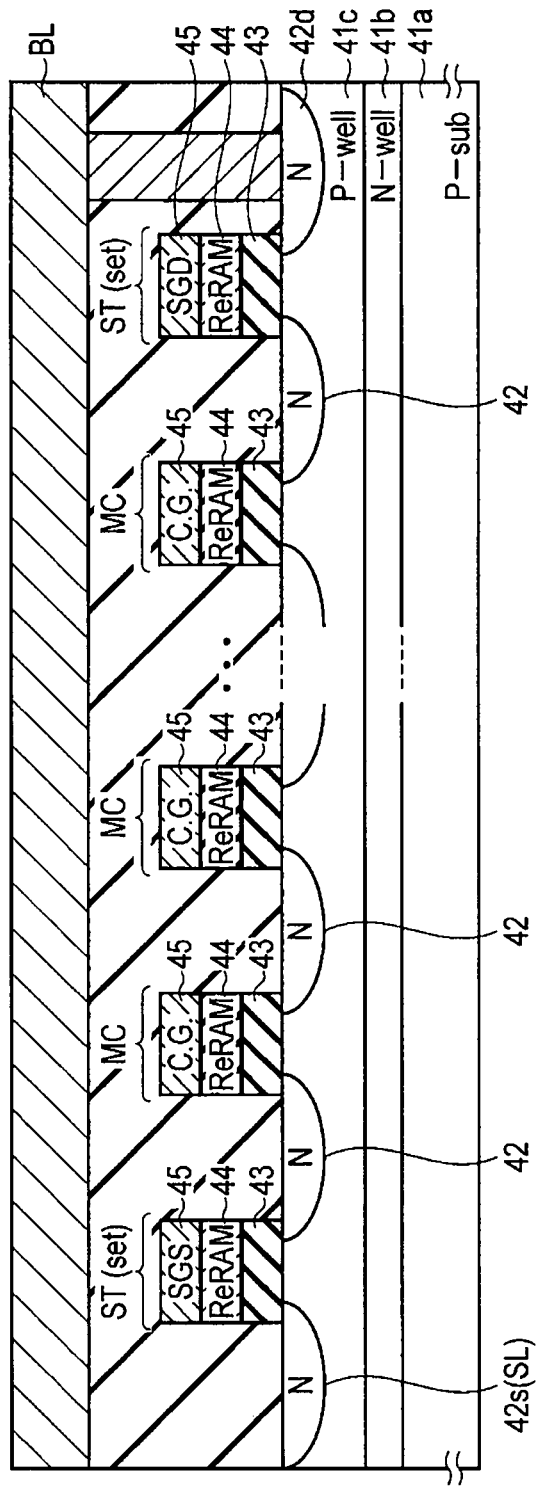
FIGS. 15 to 17 are views each showing the structure of the NAND cell unit.

FIG. 14 shows a circuit diagram of a NAND cell unit. FIG. 15 shows the structure of the NAND cell unit. In P-type semiconductor substrate 41a, N-type well region 41b, and P-type well region 41c are formed. In P-type well region 41c, a NAND cell unit according to an example of the embodiment is formed.

The NAND cell unit comprises a NAND string including memory cells MC connected in series, and a total of two select gate transistors ST each of which is connected to each end of the NAND string.

Memory cells MC and select gate transistors ST each have the same structure. More specifically, each of them comprises gate insulating layer 43 on a channel region between N-type diffusion layer 42 and N-type diffusion layer 42, recording layer (ReRAM) 44 on gate insulating layer 43, and control gate electrode 45 on recording layer 44.

It is possible to change the state (insulator/conductor) of memory cell MC by the above-mentioned basic operation. Conversely, recording layer 44 of select gate transistor ST is fixed at the set state, i.e., the conductor (resistance is small).

One of select gate transistors ST is connected to source line SL, and the other one of select gate transistors ST is connected to bit line BL.

It is assumed that before the setting (write) operation is carried out, all the memory cells in the NAND cell unit are in the reset state (resistance is large).

The setting (write) operation is carried out one by one in sequence from memory cell MC on source line SL side toward the memory cell on bit line BL side.

Potential V1 (positive potential) is applied to selected word line (control gate electrode) WL as the write potential, and potential Vpass is applied to unselected word lines WL as the transfer potential (potential by which memory cell MC is turned on).

Select gate transistor ST on source line SL side is made off, select gate transistor ST on bit line BL side is made on, and program data is transferred from bit line BL to the channel region of selected memory cell MC.

For example, when the program data is "1", a write inhibit potential (for example, a potential of the same level as V1) is transferred to the channel region of selected memory cell MC to thereby prevent the resistance value of recording layer 44 of selected memory cell MC from changing from the high-resistance state to the low-resistance state.

Further, when the program data is "0", potential V2 (<V1) is transferred to the channel region of selected memory cell MC to thereby cause the resistance value of recording layer 44 of selected memory cell MC to change from the high-resistance state to the low-resistance state.

In the resetting (erase) operation, potential V1' is applied to all word lines (control gate electrodes) WL to thereby make all memory cells MC in the NAND cell unit on. Further, two select gate transistors ST are made on, potential V3 is applied to bit line BL, and potential V4 (<V3) is applied to source line SL.

At this time, hot electrons are injected into recording layers 44 of all memory cells MC in the NAND cell unit, and hence a resetting operation is collectively executed for all memory cells MC in the NAND cell unit.

In the read operation, a read potential (positive potential) is applied to selected word line (control gate electrode) WL, and a potential assuring the on-state of memory cell MC irrespectively of whether the data is "0" or "1" is applied to unselected word lines (control gate electrode) WL.

Further, two select gate transistors ST are made on, and a read current is supplied to the NAND string.

When a read potential is applied to the selected memory cell, the memory cell is made on or off depending on the stored data value thereof, and hence the data can be read by, for example, detecting a change in the read current.

Figure 16:
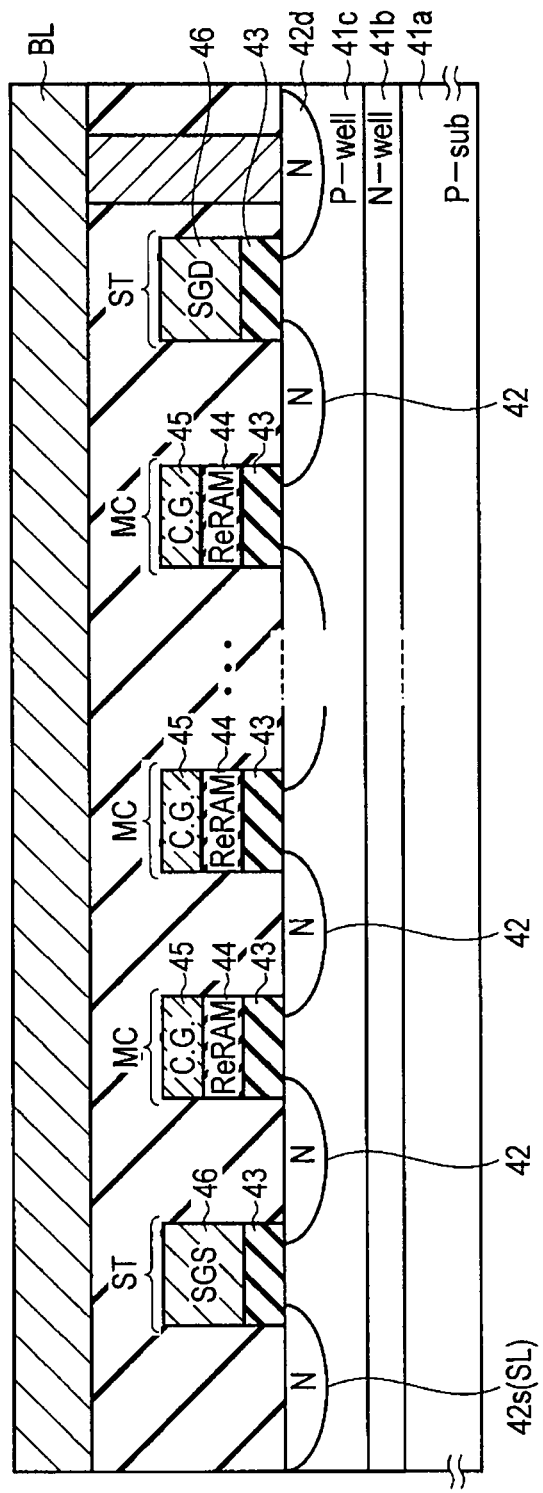

It should be noted that in the structure of FIG. 15, although select gate transistor ST has the same structure as memory cell MC, it is also possible, as shown in FIG. 16, to make select gate transistor ST an ordinary MIS transistor without forming the recording layer.

Figure 17:
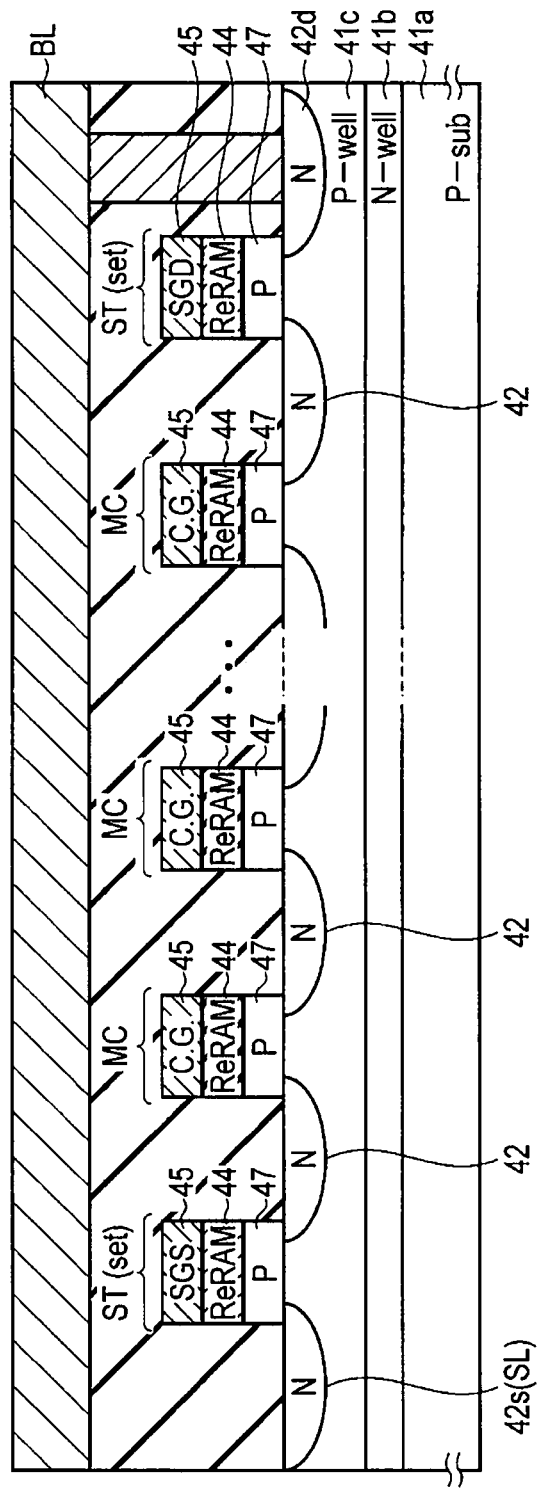

FIG. 17 shows a modification example of the NAND flash memory.

This modification example is characterized in that the gate insulating layer of each of memory cells MC constituting the NAND string is replaced with P-type semiconductor layer 47.

When the high integration progresses, and memory cell MC is made finer, P-type semiconductor layer 47 is filled with a depletion layer in a state where a voltage is not applied thereto.

At the time of setting (write), a positive write potential (for example, 3.5 V) is applied to control gate electrode 45 of selected memory cell MC, and a positive transfer potential (for example, 1 V) is applied to control gate electrodes 45 of unselected memory cells MC.

At this time, the surface of P-type well region 41c changes from the P-type to the N-type at memory cells MC in the NAND string, whereby a channel is formed.

Thus, as described above, when select gate transistor ST on bit line BL side is made on, and program data "0" is transferred from bit line BL to the channel region of selected memory cell MC, the setting operation can be carried out.

Resetting (erase) can be collectively carried out for all memory cells MC constituting the NAND string by applying a negative erase potential (for example, −3.5 V) to, for example, all control gate electrodes 45, and applying the ground potential (0 V) to P-type well region 41c, and P-type semiconductor layers 47.

At the time of read, a positive read potential (for example, 0.5 V) is applied to control gate electrode 45 of selected memory cell MC, and a transfer potential (for example, 1 V) assuring the on-state of memory cell MC irrespectively of whether the data is "0" or "1" is applied to control gate electrodes 45 of unselected memory cells MC.

However, it is assumed that threshold voltage Vth "1" of memory cell MC in the "1" state is within the range of 0 V<Vth "1"<0.5 V, and threshold voltage Vth "0" of the memory cell in the "0" state is within the range of 0.5 V<Vth "0"<1 V.

Further, two select gate transistors ST are made on, and the read current is supplied to the NAND string.

When such a state is formed, the amount of the current flowing through the NAND string changes according to the value of data stored in selected memory cell MC, and hence it is possible to read the data by detecting the change.

It should be noted that in this modification example, it is desirable that the hole doping amount of P-type semiconductor layer 47 be greater than that of P-type well region 41c, and the Fermi level of P-type semiconductor layer 47 be deeper than that of P-type well region 41c by about 0.5 V.

This is desirable for the purpose of causing a change from the P-type to the N-type to start, when the positive potential is applied to control gate electrode 45, from the surface part of P-type well region 41c between N-type diffusion layers 42 to thereby form a channel.

By carrying out the operation described above, for example, at the time of write, a channel of unselected memory cell MC is formed only at the interface between P-type well region 41c and P-type semiconductor layer 47 and, at the time of read, a channel of each of memory cells MC in the NAND string is formed only at the interface between P-type well region 41c and P-type semiconductor layer 47.

That is, even when recording layer 44 of memory cell MC is the conductor (set state), diffusion layer 42 and control gate electrode 45 are never short-circuited.

(4) NOR Flash Memory

Figure 18:
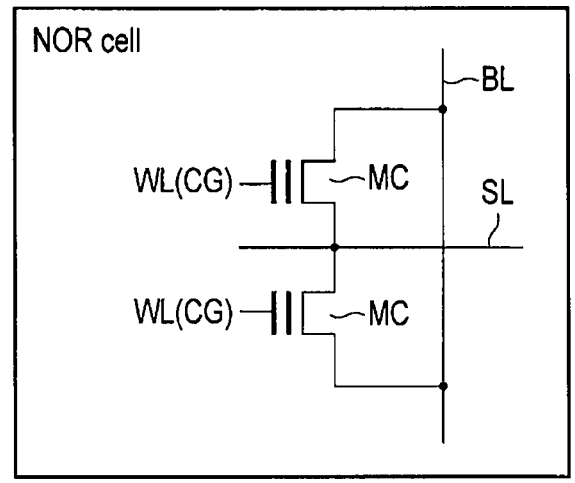
FIG. 18 is a circuit diagram showing a NOR cell.
Figure 19:
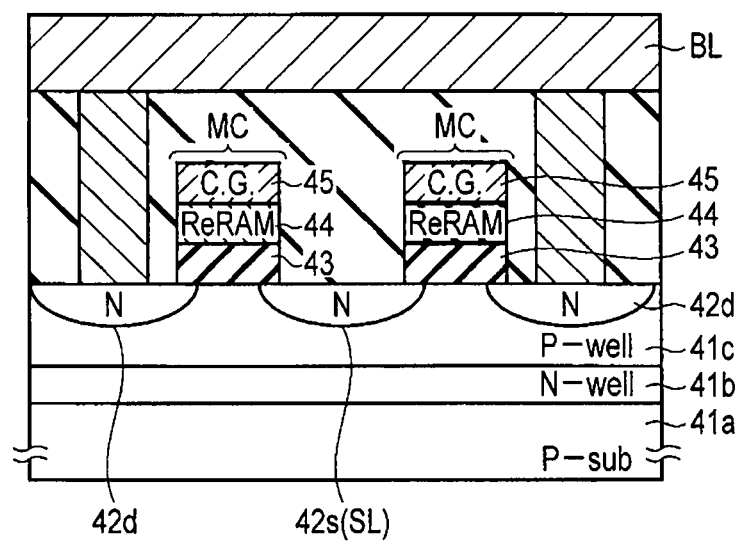
FIG. 19 is a view showing the structure of the NOR cell.

FIG. 18 shows a circuit diagram of a NOR cell unit. FIG. 19 shows the structure of the NOR cell unit.

In P-type semiconductor substrate 41a, N-type well region 41b, and P-type well region 41c are formed. In P-type well region 41c, the NOR cell is formed.

The NOR cell comprises one memory cell (MIS transistor) MC connected between bit line BL and source line SL.

Memory cell MC comprises N-type diffusion layer 42, gate insulating layer 43 on a channel region between N-type diffusion layers 42, recording layer (ReRAM) 44 on gate insulating layer 43, and control gate electrode 45 on recording layer 44.

The state (insulator/conductor) of recording layer 44 of memory cell MC can be changed by the above-mentioned basic operation.

(5) Two Transistor Flash Memory

FIG. 20 shows a circuit diagram of a two transistor cell unit. FIG. 21 shows the structure of the two transistor cell unit.

The two transistor cell unit has been developed as a cell unit of a new cell structure having both the feature of the NAND cell unit, and feature of the NOR cell.

In P-type semiconductor substrate 41a, N-type well region 41b and P-type well region 41c are formed. In P-type well region 41c, a two transistor cell unit according to an example of the embodiment is formed.

The two transistor cell unit comprises one memory cell MC and one select gate transistor ST which are connected in series.

Memory cell MC and select gate transistor ST have the same structure. More specifically, each of them comprises gate insulating layer 43 on a channel region between N-type diffusion layer 42 and N-type diffusion layer 42, recording layer (ReRAM) 44 on gate insulating layer 43, and control gate electrode 45 on recording layer 44.

The state (insulator/conductor) of recording layer 44 of memory cell MC can be changed by the above-mentioned basic operation. Conversely, recording layer 44 of select gate transistor ST is fixed at the set state, i.e., the conductor (resistance is small).

Select gate transistor ST is connected to source line SL, and memory cell MC is connected to bit line BL.

The state (insulator/conductor) of recording layer 44 of memory cell MC can be changed by the above-mentioned basic operation.

Figure 22:
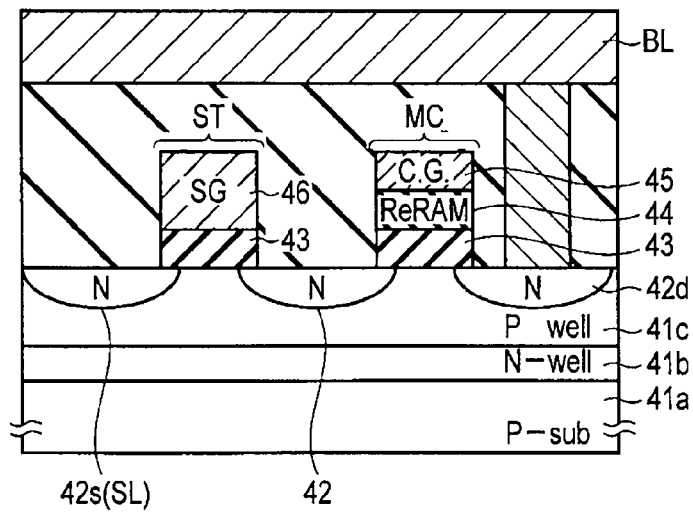

In the structure of FIG. 1, although select gate transistor ST has the same structure as memory cell MC, as shown in, for example, FIG. 22, it is also possible to make select gate transistor ST an ordinary MIS transistor without forming the recording layer.

6. EXPERIMENTAL EXAMPLES

Experimental examples in which various samples are prepared, and evaluation is made on the cycle life will be described below.

As a sample, a simplified sample in which a recording section is formed on a disk comprising a glass substrate having a diameter of about 60 mm, and thickness of about 1 mm is adopted.

(1) First Experimental Example

The sample of the first experimental example is as follows.

The recording section comprises a lamination of an electrode layer, recording layer, and protection layer. The electrode layer is a Pt film formed on the disk in a thickness of about 500 nm. The recording layer is made of $ZnV_2O_{3.9}F_{0.1}$, and the protection layer is made of diamond-like carbon (DLC).

The substance $ZnV_2O_{3.9}F_{0.1}$ is formed on the disk in a thickness of about 10 nm by keeping, for example, the temperature of the disk at a value within a range from 300° C. to 600° C., and carrying out RF magnetron sputtering in an atmosphere with an Ar concentration of 95%, and $O_2$ concentration of 5%. It should be noted that the sputtering target was prepared by compounding an oxide and fluoride of each element to obtain a desired composition ratio, and mixing the resultant to obtain a uniform mixture, and thereafter sintering the mixture in an Ar gas at a temperature of about 700 to 800° C. Further the diamond-like carbon is formed by, for example, the CVD method on the $ZnV_2O_{3.9}F_{0.1}$ in a thickness of about 3 nm.

Evaluation of the sample is carried out by using a probe made of tungsten (W) having a sharpened distal end diameter of which is 10 nm or less.

The distal end of the probe is brought into contact with the surface of the recording section, and write is carried out by applying a voltage pulse having a pulse width of 10 nsec, and voltage of 1 V between the electrode layer and probe, and erase is carried out by applying a voltage pulse having a pulse width of 100 nsec, and voltage of 0.2 V between the electrode layer and probe.

After each of the write operation, and erase operation, a voltage pulse having a pulse width of 10 nsec, and voltage of 0.1 V was applied between the electrode layer and probe, and thereafter the resistance value of the recording layer was measured.

In the initial (erase) state, the resistance value was of the order of $10^7 \Omega$, whereas the resistance value changed to a value of the order of $10^3 \Omega$ in the record (write) state.

(2) Second Experimental Example

In the second experimental example, the same sample as the first experimental example is used except that the composition of the recording layer is changed to $ZnCr_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(3) Third Experimental Example

In the third experimental example, the same sample as the first experimental example is used except that the composition of the recording layer is changed to $ZnMn_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(4) Fourth Experimental Example

In the fourth experimental example, the same sample as the first experimental example is used except that the composition of the recording layer is changed to $ZnCo_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(5) Fifth Experimental Example

In the fifth experimental example, the same sample as the first experimental example is used except that the composition of the recording layer is changed to $MgCr_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(6) Sixth Experimental Example

In the sixth experimental example, the same sample as the first experimental example is used except that the composition of the recording layer is changed to $MgMn_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(7) Seventh Experimental Example

In the seventh experimental example, the same sample as the first experimental example is used except that the composition of the recording layer is changed to $MgCo_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(8) Eighth Experimental Example

In the eighth experimental example, the same sample as the first experimental example is used except that the composition of the recording layer is changed to $CoMn_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(9) Ninth Experimental Example

In the ninth experimental example, the same sample as the first experimental example is used except that the composition of the recording layer is changed to $CaCr_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(10) Tenth Experimental Example

In the tenth experimental example, the same sample as the first experimental example is used except that the composition of the recording layer is changed to $CaMn_2O_{3.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(11) Eleventh Experimental Example

In the eleventh experimental example, the same sample as the first experimental example is used except that the composition of the recording layer is changed to $SrMn_2O_{3.9}F_{0.1}$. Further, the manufacturing method and evaluation method are also carried out in the same manner as the first experimental example.

(12) Twelfth Experimental Example

In the twelfth experimental example, the same sample as the first experimental example is used except that the recording layer is changed to a lamination of $Ba_{0.25}Mn_2O_{3.9}F_{0.1}$ and Ba. Further, the manufacturing method and evaluation method are carried out in the same manner as the first experimental example except that $Ba_{0.25}Mn_2O_{3.9}F_{0.1}$ is formed by the sputtering method, and Ba is formed in a thickness of about 10 nm.

It was confirmed that the resistance values after the write/erase operations were, as in the first experimental example, values of the order of $10^3\Omega/10^7\Omega$, and the cycle life extended to 100000 cycles or more.

(13) Thirteenth Experimental Example

In the thirteenth experimental example, the same sample as the first experimental example is used except that the recording layer is changed to a lamination of $Zn_{0.25}Mn_2O_{3.9}F_{0.1}$ and Zn. Further, the manufacturing method and evaluation method are carried out in the same manner as the first experimental example except that $Zn_{0.25}Mn_2O_{3.9}F_{0.1}$ is formed by the sputtering method, and Zn is formed in a thickness of about 10 nm.

It was confirmed that the resistance values after the write/erase operations were, as in the first experimental example, values of the order of $10^3\Omega/10^7\Omega$, and the cycle life extended to 100000 cycles or more.

(14) Fourteenth Experimental Example

In the fourteenth experimental example, the same sample as the first experimental example is used except that the composition of the recording layer is changed to $CuAlO_{1.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(15) Fifteenth Experimental Example

In the fifteenth experimental example, the same sample as the first experimental example is used except that the composition of the recording layer is changed to $MgCrO_{2.9}F_{0.1}$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(16) Sixteenth Experimental Example

In the sixteenth experimental example, the same sample as the first experimental example is used except that the composition of the recording layer is changed to $NiWN_{1.9}F_{0.1}$, and the protection layer comprises $SnO_2$. Further, the manufacturing method and evaluation method are carried out in the same manner as the first experimental example except that $NiWN_{1.9}F_{0.1}$ is formed by the sputtering method in an atmosphere having an Ar concentration of 95%, and NH concentration of 35%.

It was confirmed that the resistance values after the write/erase operations were, as in the first experimental example, values of the order of $10^3\Omega/10^7\Omega$, and the cycle life extended to 100000 cycles or more.

(17) Seventeenth Experimental Example

In the seventeenth experimental example, the same sample as the first experimental example is used except that the composition of the recording layer is changed to $Zn_{1.2}V_{1.8}O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(18) Eighteenth Experimental Example

In the eighteenth experimental example, the same sample as the first experimental example is used except that the composition of the recording layer is changed to $Zn_{1.2}Cr_{1.8}O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(19) Nineteenth Experimental Example

In the nineteenth experimental example, the same sample as the first experimental example is used except that the composition of the recording layer is changed to $ZnAl_{1.8}Cr_{0.2}O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(20) Twentieth Experimental Example

In the twentieth experimental example, the same sample as the first experimental example is used except that the composition of the recording layer is changed to $ZnAl_{1.8}Mn_{0.2}O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(21) Twenty-First Experimental Example

In the twenty-first experimental example, the same sample as the first experimental example is used except that the composition of the recording layer is changed to $Mn_3O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(22) Twenty-Second Experimental Example

In the twenty-second experimental example, the same sample as the first experimental example is used except that the composition of the recording layer is changed to $Co_3O_{3.9}F_{0.1}$, and the protection layer comprises $SnO_2$. Further, the manufacturing method and evaluation method are also carried out in the same manner as the first experimental example.

It was confirmed that the resistance values after the write/erase operations were, as in the first experimental example, values of the order of $10^3\Omega/10^7\Omega$, and the cycle life extended to 100000 cycles or more.

(23) First Comparative Example

In the first comparative example, the same sample as the first experimental example is used except that the composition of the recording layer is changed to $ZnV_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 2360 cycles.

(24) Second Comparative Example

In the second comparative example, the same sample as the first experimental example is used except that the composition of the recording layer is changed to $ZnCr_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 3784 cycles.

(25) Third Comparative Example

In the third comparative example, the same sample as the first experimental example is used except that the composition of the recording layer is changed to $ZnMn_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 12313 cycles.

(26) Fourth Comparative Example

In the fourth comparative example, the same sample as the first experimental example is used except that the composition of the recording layer is changed to $ZnCo_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 1549 cycles.

(27) Fifth Comparative Example

In the fifth comparative example, the same sample as the first experimental example is used except that the composition of the recording layer is changed to $MgCr_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 653 cycles.

(28) Sixth Comparative Example

In the sixth comparative example, the same sample as the first experimental example is used except that the composition of the recording layer is changed to $MgMn_2O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 2413 cycles.

(29) Seventh Comparative Example

In the seventh comparative example, the same sample as the first experimental example is used except that the composition of the recording layer is changed to $Mn_3O_4$. Further, the manufacturing method and evaluation method are also carried out in the same manner as the first experimental example.

Although the resistance values after the write/erase operations were, as in the first experimental example, values of the order of $10^3\Omega/10^7\Omega$, the cycle life was 1313 cycles.

(30) Eighth Comparative Example

In the eighth comparative example, the same sample as the first experimental example is used except that the composition of the recording layer is changed to $Co_3O_4$. Further, the manufacturing method and evaluation method are also carried out in the same manner as the first experimental example.

Although the resistance values after the write/erase operations were, as in the first experimental example, values of the order of $10^3\Omega/\mathbf{10^7}\Omega$, the cycle life was 2113 cycles.

(31) Summary

As has been described above, although each of the samples of the first to twenty-second experimental examples has the cycle life of 100000 cycles or more, each of the samples of the first to eighth comparative examples has the cycle life of 20000 cycles or less, and the advantage of the information recording/reproducing device of the example has thus been confirmed.

It should be noted that Table 1 shows a summary of the first to twenty-second experimental examples, and Table 2 shows a summary of verification results of the first to eighth comparative examples.

TABLE 1

|  | Material of recording layer | Crystalline structure | Protection layer | Cycle life |
|---|---|---|---|---|
| First experimental example | $ZnV_2O_{3.9}F_{0.1}$ | Spinel | DLC | >$10^5$ |
| Second experimental example | $ZnCr_2O_{3.9}F_{0.1}$ | Spinel | DLC | >$10^5$ |
| Third experimental example | $ZnMn_2O_{3.9}F_{0.1}$ | Spinel (hetaerolite) | DLC | >$10^5$ |
| Fourth experimental example | $ZnCo_2O_{3.9}F_{0.1}$ | Spinel | DLC | >$10^5$ |
| Fifth experimental example | $MgCr_2O_{3.9}F_{0.1}$ | Spinel | DLC | >$10^5$ |
| Sixth experimental example | $MgMn_2O_{3.9}F_{0.1}$ | Spinel | DLC | >$10^5$ |
| Seventh experimental example | $MgCo_2O_{3.9}F_{0.1}$ | Spinel | DLC | >$10^5$ |
| Eighth experimental example | $CoMn_2O_{3.9}F_{0.1}$ | Spinel | DLC | >$10^5$ |
| Ninth experimental example | $CaCr_2O_{3.9}F_{0.1}$ | Malachite | DLC | >$10^5$ |
| Tenth experimental example | $CaMn_2O_{3.9}F_{0.1}$ | Malachite | DLC | >$10^5$ |
| Eleventh experimental example | $SrMn_2O_{3.9}F_{0.1}$ | Cryptomelane | DLC | >$10^5$ |
| Twelfth experimental example | $Ba_{0.25}Mn_2O_{3.9}F_{0.1}$ + Ba | Cryptomelane | DLC | >$10^5$ |
| Thirteenth experimental example | $Zn_{0.25}Mn_2O_{3.9}F_{0.1}$ + Zn | Ramsdellite | DLC | >$10^5$ |
| Fourteenth experimental example | $CuAlO_{1.9}F_{0.1}$ | Delafossite | DLC | >$10^5$ |
| Fifteenth experimental example | $MgCrO_{2.9}F_{0.1}$ | Ilmenite | DLC | >$10^5$ |
| Sixteenth experimental example | $NiWN_{1.9}F_{0.1}$ | $LiMoN_2$ | $SnO_2$ | >$10^5$ |
| Seventeenth experimental example | $Zn_{1.2}V_{1.8}O_{3.9}F_{0.1}$ | Spinel | $SnO_2$ | >$10^5$ |
| Eighteenth experimental example | $Zn_{1.2}Cr_{1.8}O_{3.9}F_{0.1}$ | Spinel | $SnO_2$ | >$10^5$ |
| Nineteenth experimental example | $ZnAl_{1.8}Cr_{0.2}O_{3.9}F_{0.1}$ | Spinel | $SnO_2$ | >$10^5$ |
| Twentieth experimental example | $ZnAl_{1.8}Mn_{0.2}O_{3.9}F_{0.1}$ | Spinel | $SnO_2$ | >$10^5$ |
| Twenty-first experimental example | $Mn_3O_{3.9}F_{0.1}$ | Spinel | $SnO_2$ | >$10^5$ |
| Twenty-second experimental example | $Co_3O_{3.9}F_{0.1}$ | Spinel | $SnO_2$ | >$10^5$ |

TABLE 2

|  | Material of recording layer | Crystalline structure | Protection layer | Cycle life |
|---|---|---|---|---|
| First comparative example | $ZnV_2O_4$ | Spinel | DLC | 2360 |
| Second comparative example | $ZnCr_2O_4$ | Spinel | DLC | 3784 |
| Third comparative example | $ZnMn_2O_4$ | Spinel (hetaerolite) | DLC | 12313 |
| Fourth comparative example | $ZnCo_2O_4$ | Spinel | DLC | 1549 |
| Fifth comparative example | $MgCr_2O_4$ | Spinel | DLC | 653 |
| Sixth comparative example | $MgMn_2O_4$ | Spinel | DLC | 2413 |
| Seventh comparative example | $Mn_3O_4$ | Spinel | DLC | 1313 |
| Eighth comparative example | $Co_3O_4$ | Spinel | DLC | 2113 |

7. Relationship Between Halogen Content and Cycle Life

In the example, regarding the material ($A_xM_yX_4$, $A_xM_yX_3$, $A_xM_yX_4$) of the recording layer, X contains O or N as a chief ingredient, and contains 1% or more and 30% or less of a halogen element.

Table 3 is an experimental result showing a relationship between the halogen content and cycle life.

TABLE 3

| | Cycle life | | | |
|---|---|---|---|---|
| x | $Mn_3O_{4-x}F_x$ | $MnAl_2O_{4-x}F_x$ | $CoAl_2O_{4-x}F_x$ | $Mn_3O_{4-x}Cl_x$ |
| 0 | 3131 | 1203 | 2560 | 3131 |
| 0.001 | 3001 | 1302 | 3221 | 3565 |
| 0.003 | 4104 | 2580 | 4336 | 4372 |
| 0.01 | 5006 | 3806 | 7608 | 4562 |
| 0.03 | 20034 | 15400 | 32702 | 12563 |
| 0.1 | 100000 | 100000 | 100000 | 100000 |
| 0.3 | 100000 | 100000 | 100000 | 100000 |
| 1 | 100000 | 100000 | 100000 | 100000 |
| 1.3 | 8025 | 6034 | 9845 | 30000 |
| 1.7 | 643 | 435 | 326 | 21 |

Here, $Mn_3O_{4-x}F_x$ means that the anionic species (X) of $Mn_3X_4$ are the oxygen element (O) and fluorine element (F). Likewise, $MnAl_2O_{4-x}F_x$ means that the anionic species (X) of $MnAl_2X_4$ are the oxygen element (O) and fluorine element (F), $CoAl_2O_{4-x}F_x$ means that the anionic species (X) of $CoAl_2X_4$ are the oxygen element (O) and fluorine element (F), and $Mn_3O_{4-x}Cl_x$ means that the anionic species of $Mn_3X_4$ are the oxygen element (O) and chlorine element (Cl).

Further, the ratio R of the halogen element (here, F or Cl) contained in the anionic species (X) is expressed by the following formula.

$$R = x/((4-x)+x)$$

Figure 23:
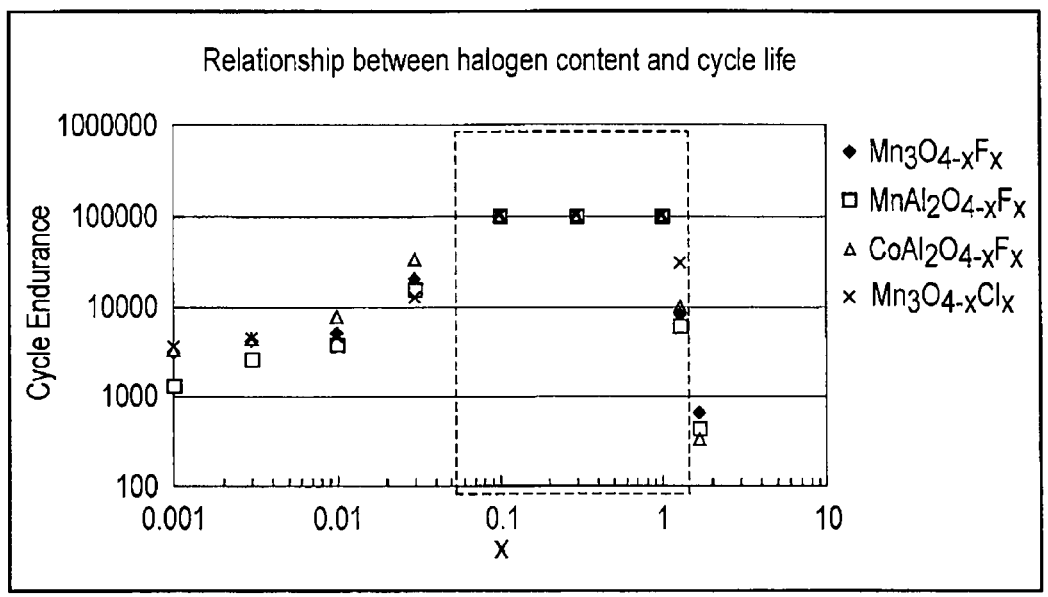
FIG. 23 is a view showing a relationship between the halogen content and cycle life.

What expresses the result of Table 3 as a graph is FIG. 23. According to FIG. 23, it is understood that a cycle life of 100000 cycles can be realized in the range of $0.04 \leq x \leq 51.2$.

When the above range is expressed in terms of the ratio R of the halogen element contained in the anionic species (X), $0.01 \leq R \leq 0.3$ is obtained.

That is, the advantage of improving the cycle life is exhibited when the ratio of the halogen element contained in the anionic species (X) is 1% or more and 30% or less.

8. Conclusion

According to the example, it is possible to realize significant extension of the cycle life by addition of halogen in addition to the existing performance. As a result, it is possible to realize an information recording/reproducing device of high recording density, low power consumption, and non-volatility.

As described above, according to the example, it is made possible to realize an information recording/reproducing device possessing the performance unattainable by the conventional technique. Accordingly, the example provides an enormous industrial advantage as a next-generation technique breaking through the barrier of the recording density of the existing nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information recording/reproducing device comprising:
   a recording layer; and
   a recording circuit configured to record information by generating a phase change in the recording layer while applying a voltage to the recording layer, wherein
   the recording layer comprises a compound including at least one type of cationic element, and at least one type of anionic element, at least the one type of cationic element is a transition element including a d orbital incompletely filled with electrons, and the average shortest distance between adjacent cationic elements is 0.32 nm or less, and
   the recording layer is provided with a material selected from (i) $A_xM_yX_4$ ($0 \leq x \leq 2.2$, $1.8 \leq y \leq 3$), (ii) $A_xM_yX_3$ ($0 \leq x \leq 1.1$, $0.9 \leq y \leq 3$), and (iii) $A_xM_yX_4$ ($0 \leq x \leq 1.1$, $0.9 \leq y \leq 3$), where,
   regarding (i) and (ii), A is at least one type of element selected from a group comprising Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb, and Bi; and
   M is at least one type of element selected from a group comprising Al, Ga, Ti, Ge, Sn, V, Cr, Mn, Fe, Co, Ni, Nb, Ta, Mo, W, Ru, and Rh,
   regarding (iii), A is at least one type of element selected from a group comprising Mg, Ca, Sr, Al, Ga, Sb, Ti, V, Cr, Mn, Fe, Co, Rh, In, Sb, Tl, Pb, and Bi; and
   M is at least one type of element selected from a group comprising Al, Ga, Ti, Ge, Sn, V, Nb, Ta, Cr, Mn, Mo, W, Ir, and Os, and
   regarding (i), (ii) and (iii), X contains O or N as a chief ingredient, and contains a halogen element of 1% or more and 30% or less.

2. The device of claim 1, wherein
the recording layer comprises a crystalline structure selected from the spinel structure, the cryptomelane structure, the ilmenite structure, the hollandite structure, the wolframite structure, the hetaerolite structure, the ramsdellite structure, the delafossite structure, the $\alpha$-NaFeO$_2$ structure, and the LiMoN$_2$ structure.

3. The device of claim 1, wherein
the recording circuit includes a head configured to locally apply the voltage to the recording layer.

4. The device of claim 3, wherein
the head is a cantilever mounted on a substrate.

5. The device of claim 1, wherein
the recording circuit includes a word line and a bit line between which the recording layer is interposed.

6. The device of claim 5, wherein
the recording circuit includes a diode arranged between the word line and the bit line, and connected in series to the recording layer.

7. The device of claim 5, wherein
the recording circuit includes a heater layer arranged between the word line and the bit line, and connected in series to the recording layer.

8. The device of claim 1, wherein
the recording circuit includes a MIS transistor, and the recording layer is arranged between a gate electrode and a gate insulating layer of the MIS transistor.

9. The device of claim 8, wherein
the MIS transistor comprises a memory cell in a NAND cell unit.

10. The device of claim 8, wherein
the MIS transistor comprises a NOR cell.

11. The device of claim 8, wherein
the MIS transistor comprises a memory cell in a two transistor cell unit.

12. The device of claim 1, further comprising:
a first electrode layer arranged at one end of the recording layer; and
a second electrode layer arranged at the other end of the recording layer.

13. The device of claim 12, wherein
one of the first and second electrode layers which functions as a positive electrode when the information is recorded in the recording layer comprises one of electro-conductive nitride and electro-conductive oxide.

14. The device of claim 12, wherein
one of the first and second electrode layers which functions as a negative electrode when the information is recorded in the recording layer comprises one of amorphous carbon, diamond-like carbon, and SnO$_2$.

* * * * *